(12) United States Patent
Nogawa et al.

(10) Patent No.: US 7,009,440 B2
(45) Date of Patent: Mar. 7, 2006

(54) PULSE SIGNAL GENERATOR AND DISPLAY DEVICE

(75) Inventors: Masashi Nogawa, Tokyo (JP); Tetsuo Tateishi, Warwick, RI (US); Hiroko Nakamura, Saitama (JP)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 10/863,184

(22) Filed: Jun. 7, 2004

(65) Prior Publication Data

US 2005/0017778 A1 Jan. 27, 2005

(30) Foreign Application Priority Data

Jun. 6, 2003 (JP) .............................. 2003-161979

(51) Int. Cl.
*G06F 1/04* (2006.01)

(52) U.S. Cl. ...................................... 327/291; 327/296

(58) Field of Classification Search ................ 327/165, 327/291, 292, 293, 294, 295, 296, 298

See application file for complete search history.

(56) References Cited

U.S. PATENT DOCUMENTS 5,164,704 A * 11/1992 Steen et al. ............ 340/539.17

* cited by examiner

*Primary Examiner*—Linh M. Nguyen
(74) *Attorney, Agent, or Firm*—William B. Kempler; W. James Brady, III; Frederick J. Telecky, Jr.

(57) ABSTRACT

The objective of this invention is to provide a pulse signal generator with a simple constitution that can reduce the number of signals required for setting the pulse width, as well as a display device using said pulse signal generator. Pulse assignment signal DP0 input to the initial stage of pulse signal generating units PG(i,0)–PG(i,39) connected in cascade is sequentially transferred towards the last stage of the cascade connection. After transfer of the pulse assignment signal to the pulse signal generating unit in each stage, the count value of said pulse signal generating unit is initialized. Then, the pulses of pulse strings PS0–PS39 in the various pulse signal generating units are counted. The count value of the pulse string is compared to the pulse assignment signal in the comparison unit of each pulse signal generating unit, and, in accordance with the comparison result, the level of the drive pulse signal of the LED is inverted. The pulse intervals (pulse timing) of pulse strings PS0–PS39 are controlled individually by control unit 1 so that the drive pulse signal output from the pulse signal generating unit has the desired pulse width.

20 Claims, 15 Drawing Sheets

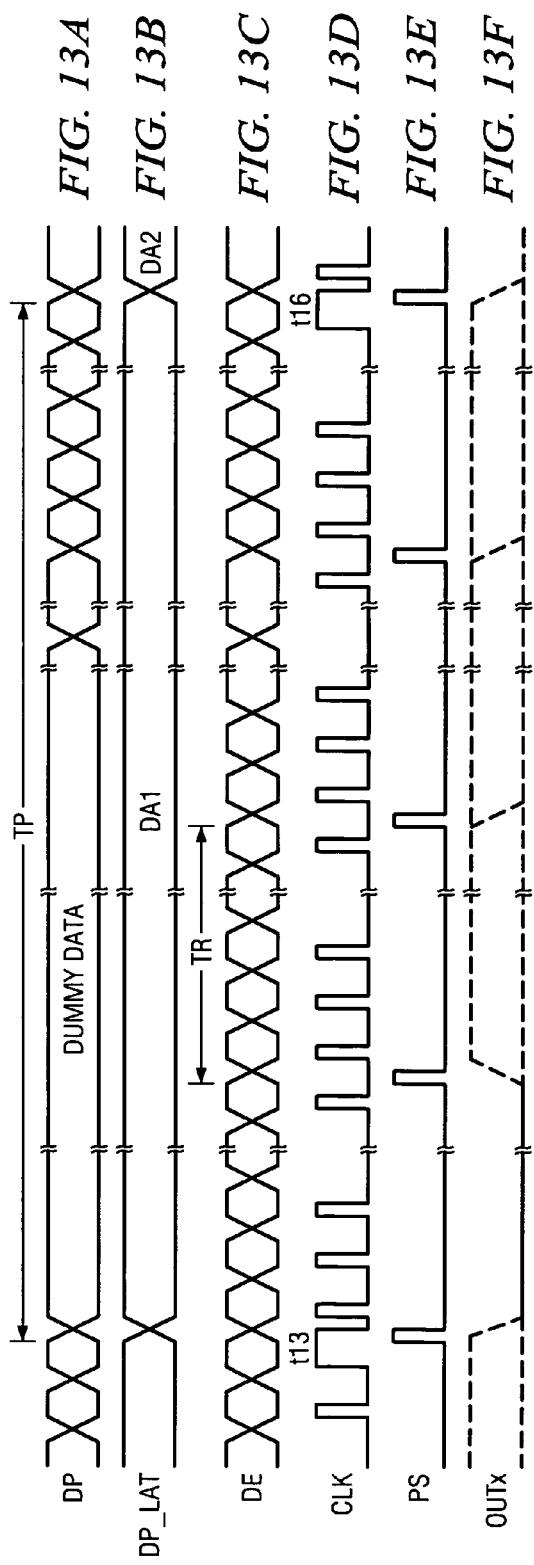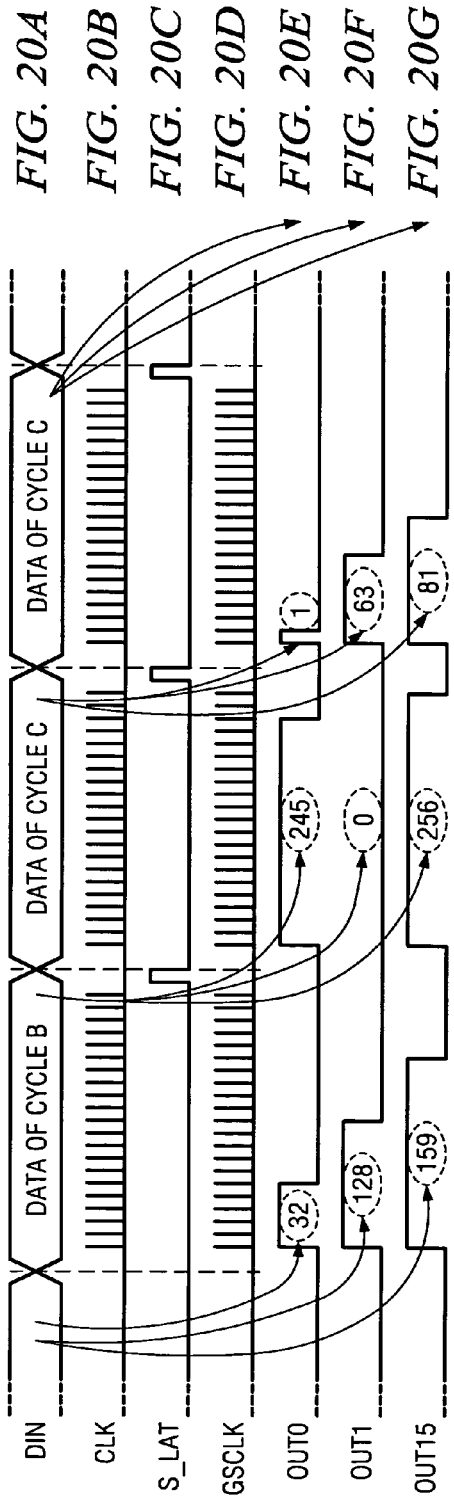

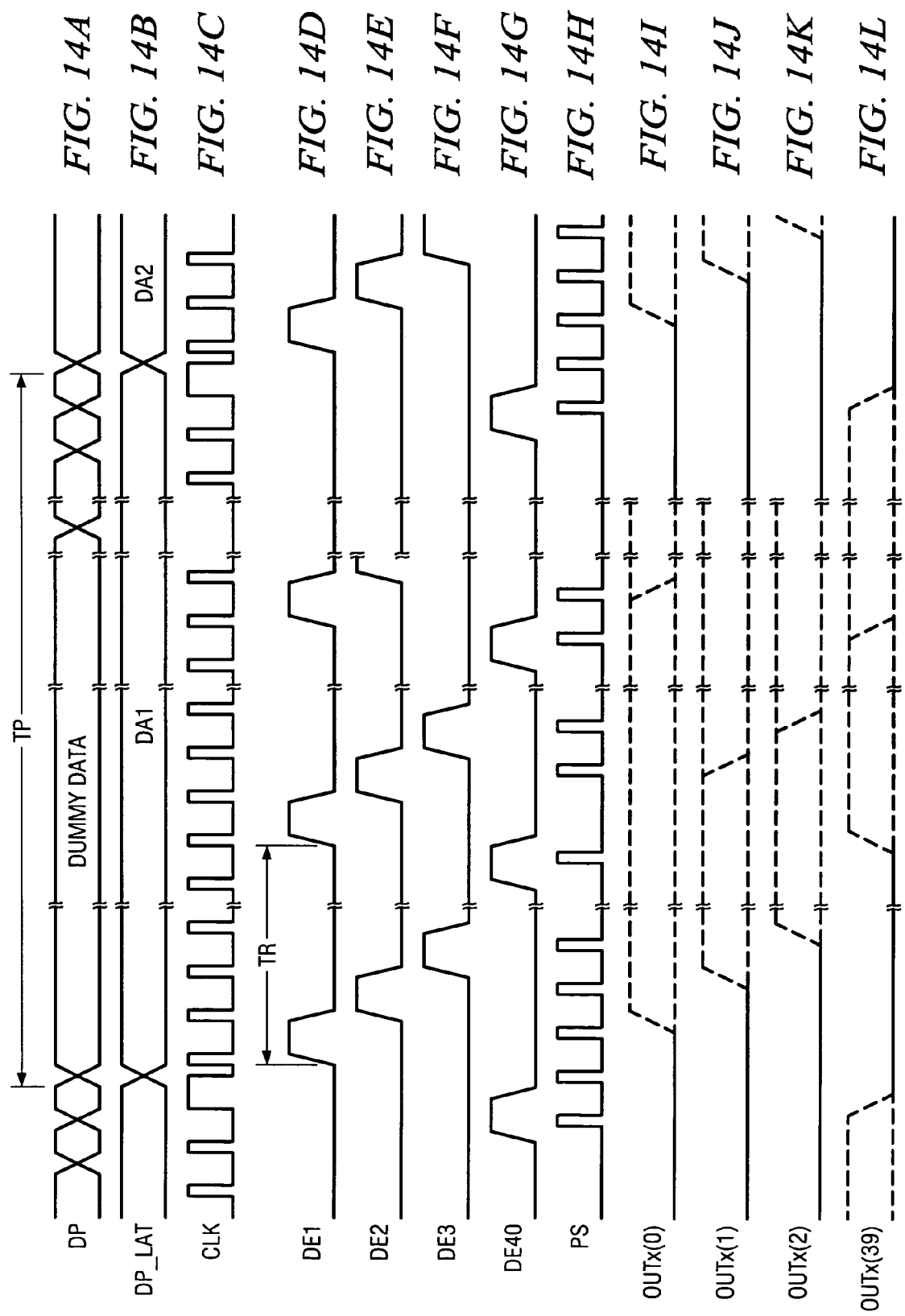

PULSE SIGNAL GENERATOR AND DISPLAY DEVICE

FIELD OF THE INVENTION

The present invention pertains to a pulse signal generator, such as a pulse signal generator that generates pulse signals for driving LEDs or other display elements in a PWM (pulse width modulation) system, and a display device having said pulse signal generator.

BACKGROUND OF THE INVENTION

In recent years, large LED display devices have enjoyed great popularity in concert halls, stadiums, public squares, and other locations.

LED display devices usually have hundreds of thousands of LEDs to display the various pixels making up the various images, LED drive ICs (hereinafter referred to as LED drivers) for driving said LEDs, and controllers for controlling the LED drivers corresponding to the gradation information of the pixels. Said LEDs are driven with pulse currents supplied from said LED driver. For example, they are driven to be on/off for about 200 cycles/sec. Because the on/off period is very short, the luminance of the LED appear continuous to human eye due to the image persistence phenomenon of human vision. The luminance of the LED, that is, the luminance of the pixel can be set stepwise as the pulse width of the pulse current is changed corresponding to the gray level information. For example, the pulse width of the pulse current can be adjusted in 256 steps corresponding the 8-bit gray level information.

Generally speaking, there are two types of LED drivers: the single-grayscale type and the PWM grayscale control type. With the single-grayscale type of LED driver, the 1-bit information that controls LED on/off is received one by one from the controller in the operation. On the other hand, with the PWM grayscale control type of LED driver, the gradation information is received from the controller, and a pulse signal having a pulse width corresponding to the gradation information is generated in the driver.

(Single-grayscale Type LED Driver)

FIG. 17 is a block diagram illustrating a portion of the constitution of an example of the LED display device using a single-grayscale type LED driver. It shows the constitution of the pixels of one line of the overall image.

The LED display device shown in FIG. 17 has 640 LEDs corresponding to 640 pixels per line, LED drivers IC0–IC39 with 16 output channels for driving said LEDs, and controller CT1.

LED drivers IC0–IC39 have input terminals and output terminals for on/off control signals of LED supplied as a bit string from controller CT1, and they are connected in cascade via said input terminals and output terminals. The on/off control signal supplied from controller CT1 to LED driver IC0 of the initial stage is shifted in the order of LED drivers IC1, IC2, . . . synchronously with the common clock signal CLK, and it is finally transferred to last LED driver IC39.

LED drivers IC0–IC39 each have 16-bit shift register REG1, 16-bit latch circuit LAT1, and constant-current driver DRV1 with 16 output channels.

Shift register REG1 sequentially shifts the on/off control signal output as a bit string from the previous-stage LED driver synchronously with clock signal CLK and outputs it to the next-stage LED driver.

Synchronously with latch signal S_LAT commonly supplied from controller CT1 to LED drivers IC0–IC39, latch circuit LAT1 holds the 16-bit on/off control signal held in shift register REG1 and outputs it to constant-current driver DRV.

Constant-current driver DRV1 controls the output currents of output terminals OUT0–OUT15 connected to LED corresponding to the 16-bit on/off control signal held in latch circuit LAT1. That is, there is a one-to-one correspondence between the 16-bit on/off control signal and output terminals OUT0–OUT15. When the bit value is "1," a constant current is output from the corresponding output terminal, so that the LED is turned on. On the other hand, when the bit value is "0," the output current from the corresponding output terminal is blocked, so that the LED is turned off. Also, a constant-current output is not a necessity for driver DRV1. It is only necessary for the output current to turn on the LED.

FIG. 18 is a diagram illustrating the bit values of the on/off control signals set corresponding to the output terminals (OUT0–OUT15) of LED drivers IC0–IC39, and the current waveforms for the current flow of the various output terminals to LEDs.

640 LEDs are set to turn on/off simultaneously with latch signal S_LAT fed from controller CT1. With each on/off setting, the 16-bit on/off control signals are applied to shift register REG1 of LED drivers IC0–IC39, respectively. Consequently, clock signal CLK should have a frequency 640 times that of latch signal S_LA.

The frequency of latch signal S_LAT is determined corresponding to the refresh rate and number of gray levels of the image.

For example, when 200 images per second are to be displayed, the frequency of the pulse current output from the LED driver is 200 Hz. If the gray scale is 256, the LEDs are turned on/off for each of the 256 divisions of each period of the 200-Hz pulse current. Consequently, the frequency of latch signal S_LAT becomes about 51 kHz (200 Hz×256).

In the LED display device, in order to reduce the number of the LED drivers in use, plural LEDs are usually connected to 1 output terminal of the LED driver. Usually, the constitution is used in which the LEDs are turned on in a time division scheme.

In this case, the duty ratio (the ratio of the output period of the drive current to 1 pulse period) of the pulse current fed to each LED is limited corresponding to the number of time divisions. For example, if 4 LEDs are driven in the time division scheme (4 time divisions), the duty ratio of the pulse current fed to each LED is limited to 25% or less.

In the period of display of 1 image, pulses in the number of the time division are output. Consequently, if the number of time divisions is 4, compared to the case when the number of time divisions is 1, the frequency of the pulse current output from the LED driver become 4 times higher. Like the aforementioned example, if the refresh rate is 200 and the gray scale is 256, the frequency of the pulse current becomes 800 Hz (200 Hz×4), and the frequency of latch signal S_LAT becomes about 205 kHz (200 Hz×4×256).

Consequently, when the refresh rate is 200, the gray scale is 256, and number of time divisions is 4, frequency fmax1 of clock signal CLK required for transfer of on/off control signal to the LED display device shown in FIG. 16 is given by the following equation.

[Mathematical Formula 1]

$$f\text{max}1 = 200[\text{r.r.}] \times 4[\text{duty}] \times 256[\text{GS}] \times 640[\text{pixel}] \quad (1)$$
$$= 200[\text{r.r}] \times 4[\text{duty}] \times 256[\text{GS}] \times 40[\text{IC}] \times 16[\text{output}]$$
$$= 131[\text{MHz}]$$

In Equation 1, [r.r.] stands for the refresh rate; [duty] refers to the number of time divisions; [pixel] refers to the number of pixels; [GS] refers to the gray scale; [IC] refers to the number of LED drivers; and [output] refers to the number of output channels in the LED driver.

(PWM Grayscale Control Type LED Driver)

FIG. 19 is a block diagram illustrating a portion of the constitution of an example of the LED display device made up of PWM grayscale control type LED driver. Just as FIG. 17, the constitution corresponds to the pixels for 1 line of the total image.

The LED display device shown in FIG. 19 has 640 LEDs, corresponding to 640 pixels per line, LED drivers IC0A–IC39A with 16 output channels and driving said LEDs, and controller CT1A.

LED drivers IC0A–IC39A have input terminals and output terminals of the pulse width setting signals of LEDs fed as a bit string from controller CT1A, and they are connected in cascade via said input terminals and output terminals.

Said LED drivers IC0A–IC39A each have 128 (8×16)-bit shift register REG2, 128 (8×16)-bit latch circuit LAT2, PWM generator PW1, and constant-current driver DRV1. Here, the same part numbers adopted in FIGS. 17 and 19 represent the same structural elements.

Shift register REG2 sequentially shifts the pulse assignment signals output as bit strings from the previous-stage LED driver sequentially synchronously with clock signal CLK, and outputs the signals to the next-stage LED driver.

Synchronously with latch signal S_LAT commonly fed from controller CT1A to LED drivers, latch circuit LAT2 holds the 128-bit pulse width setting signal held in shift register REG2, and outputs the signal to PWM generator PW1.

From the 128-bit pulse width setting signal held in latch circuit LAT2, PWM generator PW1 receives the 8-bit pulse width setting signals for the 16 output channels, respectively, and it generates 16 pulse signals with the corresponding pulse width.

More specifically, PWM generator PW1 counts grayscale clock signal GSCLK fed commonly from controller CT1A to the LED drivers, compares the count value to the value of the 8-bit pulse width setting signal obtained from latch circuit LAT2, and sets the values of the pulse signals corresponding to the output channels to "1" or "0." The 8-bit pulse width setting signal has a value in the range of 0–255, and corresponding to the result of comparison of said value to the count value, the timing for inverting the value of the pulse signal, that is, the pulse width, is determined. Consequently, the grayscale value becomes 256. The count value of grayscale clock signal GSCLK is initialized synchronously with reset signal S_RST fed commonly from controller CT1A to the LED drivers.

FIG. 20 is a timing diagram illustrating the timing relationship of the various signals of the LED display device shown in FIG. 19.

In shift register REG2 of LED drivers IC0A–IC39A, 128-bit pulse width setting signals are transferred in each cycle of the pulse current (FIGS. 20(E)–(G)). After completion of the transfer, the transferred pulse width setting signal is held in latch circuit LAT2 synchronously with latch signal S_LAT (FIG. 20(C)). Then, in PWM generator PW1, the count value of grayscale clock signal GSCLK is initialized, and the comparison of the new pulse width setting signal held in latch circuit LAT2 to the count value of grayscale clock signal GSCLK is initiated. The pulse width of the pulse current of the output channels is set corresponding to the comparison result.

Grayscale clock signal GSCLK (FIG. 20(D)) has a period obtained by dividing 1 period of the pulse current fed to LED (FIGS. 20(E)–(G)) by the gray scale.

As in the aforementioned example, if the refresh rate is 200 and number of time divisions is 4, the gray scale is 256, and frequency fmax2a of grayscale clock signal GSCLK can be found by the following equation.

[Mathematical Formula 2]

$$f\text{max}2a = 200[\text{r.r.}] \times 4[\text{duty}] \times 256[\text{GS}] \quad (2)$$
$$= 205[\text{kHz}]$$

Also, during 1 cycle of the pulse current, 8-bit pulse width setting signals for 640 pixels are transferred from controller CT1A to LED drivers IC0A–IC39A. Consequently, clock signal CLK should have a frequency (640×8) times that of the pulse current.

As in the aforementioned example, if the refresh rate is 200 and the number of time divisions is 4, frequency fmax2b of clock signal CLK can be found by the following equation.

[Mathematical Formula 3]

$$f\text{max}2b = 200[\text{r.r.}] \times 4[\text{duty}] \times 640[\text{pixel}] \times 8[\text{bit}] \quad (3)$$
$$= 4.1[\text{MHz}]$$

The single-grayscale type LED driver allows for a relatively simple circuit constitution. Thus, the cost can be held down, which is advantageous.

However, each LED should be turned on/off individually. Consequently, a very high communication speed is required between the controller and the LED driver, which is undesirable. For example, with a square display panel measuring several meters per side, it becomes very difficult to transmit the high-frequency signal shown in Equation 1.

There is a method in which the transmission can be performed for a high-frequency signal by increasing the number of controllers and reducing the transmission distance of the signals. For example, in a commonly adopted method, an image with 640 pixels per line is divided into four sections in the horizontal line direction, and a controller is set for each image region with a width of 160 pixels. As a result, the communication distance between controller and LED driver can be reduced. However, since the number of controllers is quadrupled, the cost increases, which is undesirable.

On the other hand, the PWM grayscale control type LED driver requires less data for processing than the single-grayscale type LED driver. Consequently, the communication speed between the controller and the LED driver can be suppressed. For example, transmission of the signals at the frequency shown in Equations 2 and 3 can be performed without increasing the number of controllers.

However, the circuit constitution of the PWM grayscale control type LED driver is more complicated than that of the single-grayscale type LED driver. As a result, the cost increases, which is undesirable.

The purpose of the present invention is to solve the aforementioned problems of the conventional methods by providing a pulse signal generator which can reduce the quantity of information that must be transmitted for setting the pulse width, as well as a display device with a simple constitution utilizing said pulse signal generator.

SUMMARY OF INVENTION

In order to realize the aforementioned purpose, as the first aspect of the present invention, the present invention provides a pulse signal generator characterized by the fact that the pulse signal generator, which is used to generate plural pulse signals, comprises the following means:

a pulse arrival notification means that reports the arrival of the pulse, which is contained in the input pulse string and which is input when an enable signal indicating permission for pulse input is given, together with the information that specifies said pulse;

a pulse arrival judgment means, which uses the pulse assignment signals corresponding to said pulse signals to be generated as input, and which determines whether the pulse assigned with said pulse assignment signal has arrived for each of said pulse signals on the basis of the notification of said pulse arrival notification means;

and a pulse signal output means that inverts the output level of the pulse signal, for which arrival of said assigned pulse is judged by said pulse arrival judgment means, synchronously with the arrival of said pulse.

As a preferred scheme, it has a first signal holding means that holds the signal input to the first input terminal and outputs the held signal to a first output terminal synchronously with the input clock signal, and said pulse arrival notification means uses the signal held in said first signal holding means input to it as said enable signal.

For the first aspect of the present invention, the arrival of the pulse that is contained in the input pulse string and that is input when the enable signal indicating permission for pulse input is given is reported with the pulse arrival notification means. This notification is accompanied by the information that specifies the arrived pulse. Also, in the pulse arrival judgment means, the pulse assignment signals for the pulse signals to be generated are input, and whether a pulse assigned with the pulse assignment signal has arrived is determined on the basis of the notification from the pulse arrival notification means. When it is judged by the pulse arrival judgment means that an assigned pulse has arrived, the output level of the pulse signal that assigns the pulse in the pulse assignment signal is inverted by the pulse signal output means synchronously with the arrival of said pulse.

Because the input of the pulse string is made valid/invalid corresponding to the enable signal, when pulse signals are generated by plural pulse signal generators, it is possible to use a common pulse string given to all of the pulse signal generators so as to simplify the wiring, and, at the same time, it is possible to input the desired pulse string to each pulse signal generator corresponding to the enable signal. For example, by controlling the pulse interval of the pulse string input to each pulse signal generator corresponding to the desired pulse width of the pulse signal to be generated, it is possible to reduce the amount of information of the pulse assignment signal.

Also, in the first signal holding means, the signal input to the first input terminal is held synchronously with the clock signal, and the held signal is input as the enable signal to the pulse arrival notification means. At the same time, it is output to the first output terminal. As a result, it is possible to transmit the enable signal between the plural pulse signal generators connected in cascade via the first input terminals and first output terminals. Compared to the case when the enable signals are transmitted to the pulse signal generators through independent wirings, respectively, this scheme has a simpler wiring configuration.

Also, one may adopt the following scheme: it has a second signal holding means that holds the signal input to a second input terminal and outputs the held signal to a second output terminal synchronously with said clock signal, and a third signal holding means that holds the signal held in said second signal holding means synchronously with an input latch signal; and said pulse arrival judgment means has the signal held in said third signal holding means input to it as said pulse assignment signal.

With this scheme, it is possible to transmit the pulse assignment signal between the plural pulse signal generators connected in cascade via the second input terminals and second output terminals. Compared to the case when the pulse assignment signals are transmitted independently to the respective pulse signal generators, the wiring of this scheme is simpler.

Also, one may adopt the following scheme: said clock signal contains clock pulses, one per prescribed period, with the result of a prescribed logic operation made between said clock pulses and said pulse string becoming a prescribed value; and it has a logic operation means that outputs said result of the logic operation between said clock signal and said pulse string as said latch signal. In this scheme, it is possible to omit the wiring for transmitting the latch signal.

Also, one may adopt the following scheme: said pulse arrival notification means counts the pulses that are contained in said pulse string and that are input when said enable signal indicating permission for pulse input is given, and initializes said counting result corresponding to the result of operation of said logic operation means; and said pulse arrival judgment means compares said pulse assignment signal to the count of said pulse arrival notification means, and judges the arrival of said assigned pulse corresponding to the result of comparison.

In this scheme, pulses in the pulse string are specified corresponding to the counting result of pulses in the pulse arrival notification means. Since the count is initialized corresponding to the result of operation of the logic operation means, it is possible to omit the wiring for transmitting the initialization signal of the count.

Also, one may adopt the following scheme: it has a packet signal processing means, which determines whether the packet signal is to be received corresponding to the identification information contained in the input packet signal, and, when the decision is made for reception, it extracts said enable signal and/or said pulse assignment signal from said packet signal.

With this scheme, because the enable signal and pulse assignment signal are transmitted to the pulse signal generators as packet signals, it is possible to simplify the wiring for transmitting said signals.

According to the second aspect of the present invention, the present invention provides a display device characterized by the following facts:

it comprises plural display elements, one or more pulse signal generators that generate plural pulse strings for driving said display elements, and a control means that generates a pulse string with its pulse interval set corresponding to the desired pulse width of said pulse signal, and a pulse assignment signal that assigns the prescribed pulse in said pulse string for each said pulse signal to be generated, and sends said signals to said pulse signal generators;

wherein said pulse signal generator contains the following means:

a pulse arrival notification means that reports the arrival of the pulse, which is contained in the input pulse string and which is input when an enable signal indicating permission for pulse input is given, together with the information that specifies said pulse;

a pulse arrival judgment means, which uses the pulse assignment signals corresponding to said pulse signals to be generated as input, and which determines whether the pulse assigned with said pulse assignment signal has arrived for each of said pulse signals on the basis of the notification of said pulse arrival notification means;

and a pulse signal output means that inverts the output level of the pulse signal, for which arrival of said assigned pulse is judged by said pulse arrival judgment means synchronously with the arrival of said pulse.

According to the second aspect the present invention, a pulse string having a pulse interval corresponding to the desired pulse width of the pulse signal, and a pulse assignment signal that assigns the prescribed pulse of said pulse string with respect to each pulse signal to be generated are generated by the control means, and they are sent to the pulse signal generator. After receiving said signals, the pulse signal generator generates plural pulse signals for driving plural display elements.

By means of the pulse arrival notification means in the pulse generator, the arrival of the pulses in the input pulse string is reported, together with the information that specifies the received pulse. In the pulse arrival judgment means, the pulse assignment signal for each of the signals to be generated is input, and whether the pulse assigned by the pulse assignment signal has arrived is determined for each pulse signal on the basis of the notification of the pulse arrival notification means. When it is judged by the pulse arrival judgment means that the assigned pulse has arrived, the output level of the pulse signal that assigns the pulse in the pulse assignment signal is inverted by the pulse signal output means synchronously with arrival of said pulse.

Because the pulse width of the pulse signal is controlled in correspondence to the pulse interval of the pulse string and the pulse assignment signal, compared to the case when the control of the pulse width is performed only by the pulse assignment signal, the quantity of information to be sent with the pulse assignment signal can be reduced.

Also, with regard to the pulse arrival judgment means, the arrival of the pulse that is contained in the pulse string and that is input when the enable signal indicating permission for pulse input is given may be reported. Also, one may also adopt the following scheme: while the pulse string is output to plural pulse signal generators, the enable signal that denies or grants permission for pulse input in the pulse signal generator corresponding to said desired pulse width is generated in each pulse cycle of the pulse string.

In this way, in each pulse signal generator, the input of the pulse string is made valid or invalid corresponding to the enable signal. Consequently, it is possible to input the desired pulse string to the pulse signal generators corresponding to the enable signal while using a common pulse string sent to the plural pulse signal generators so as to simplify the wiring.

Also, one may adopt the following scheme: said pulse arrival judgment means reports the arrival of the pulse that is contained in said pulse string and that is input when an enable signal indicating permission for pulse input is given; said control means generates said enable signal that sequentially permits said pulse input for the plural pulse signal generators, and, at the same time, it outputs said pulse string, which sets the presence or absence of the pulse in each period where the pulse input of said plural pulse signal generators is permitted corresponding to said desired pulse width, to all said plural pulse signal generators.

In this scheme, in each pulse signal generator, the input of the pulse string is made valid or invalid corresponding to the enable signal. Consequently, it is possible to input the desired pulse string to the pulse signal generators corresponding to the enable signal while using the same pulse string sent to the plural pulse signal generators so as to simplify the wiring.

Also, one may adopt the following scheme: each said pulse signal generator also has a first signal holding means that holds the signal input to the first input terminal and outputs the held signal to the first output terminal synchronously with the input clock signal; said pulse arrival notification means uses the signal held in said first signal holding means input to it as said enable signal; said plural pulse signal generators are connected in cascade via said first input terminals and said first output terminals; and said control means feeds said enable signals sent to said various stages of pulse signal generators connected in cascade sequentially to the initial stage of said cascade connection synchronously with said clock signal.

In this way, it is possible to transmit the enable signal between the plural pulse signal generators connected in cascade. Compared to the case when the enable signals are sent through independent wiring to the respective pulse signal generators, with this scheme, the wiring can be simplified.

Also, one may adopt the following scheme: each said pulse signal generator has a second signal holding means that holds the signal input to a second input terminal and outputs the held signal to a second output terminal synchronously with the input clock signal, and a third signal holding means that holds the signal held in said second signal holding means corresponding to the input latch signal; said pulse arrival notification means uses the signal held in said third signal holding means as said pulse indicating signal; said plural pulse signal generators are connected in cascade via said second input terminals and said second output terminals; and said control means feeds said pulse indicating signals sent to said various stages of pulse signal generators connected in cascade sequentially to the initial stage of said cascade connection synchronously with said clock signal, and it generates said latch signal that holds said held signal in said third signal holding means at the timing for holding said pulse indicating signal in said second signal holding means of the pulse signal generator as the supplied object.

In this way, it is possible to transmit the pulse assignment signal between plural pulse signal generators connected in cascade through second input terminals and second output terminals. Compared to the case when the enable signals are sent through independent wirings to the respective pulse signal generators with this scheme, the wiring can be simplified.

BRIEF DESCRIPTION OF THE DRAWINGS

FIG. 13 is a timing diagram illustrating an example of the timing relationship between various signals of the display device of Embodiment 4 of the present invention shown in FIG. 10.

FIG. 14 is a timing diagram illustrating an example of the timing relationship between various signals of the display device of Embodiment 5 of the present invention shown in FIG. 10.

FIG. 20 is a timing diagram illustrating the timing relationship between the various signals of the LED device shown in FIG. 19.

DESCRIPTION OF EMBODIMENTS

Embodiment 1

Figure 1:
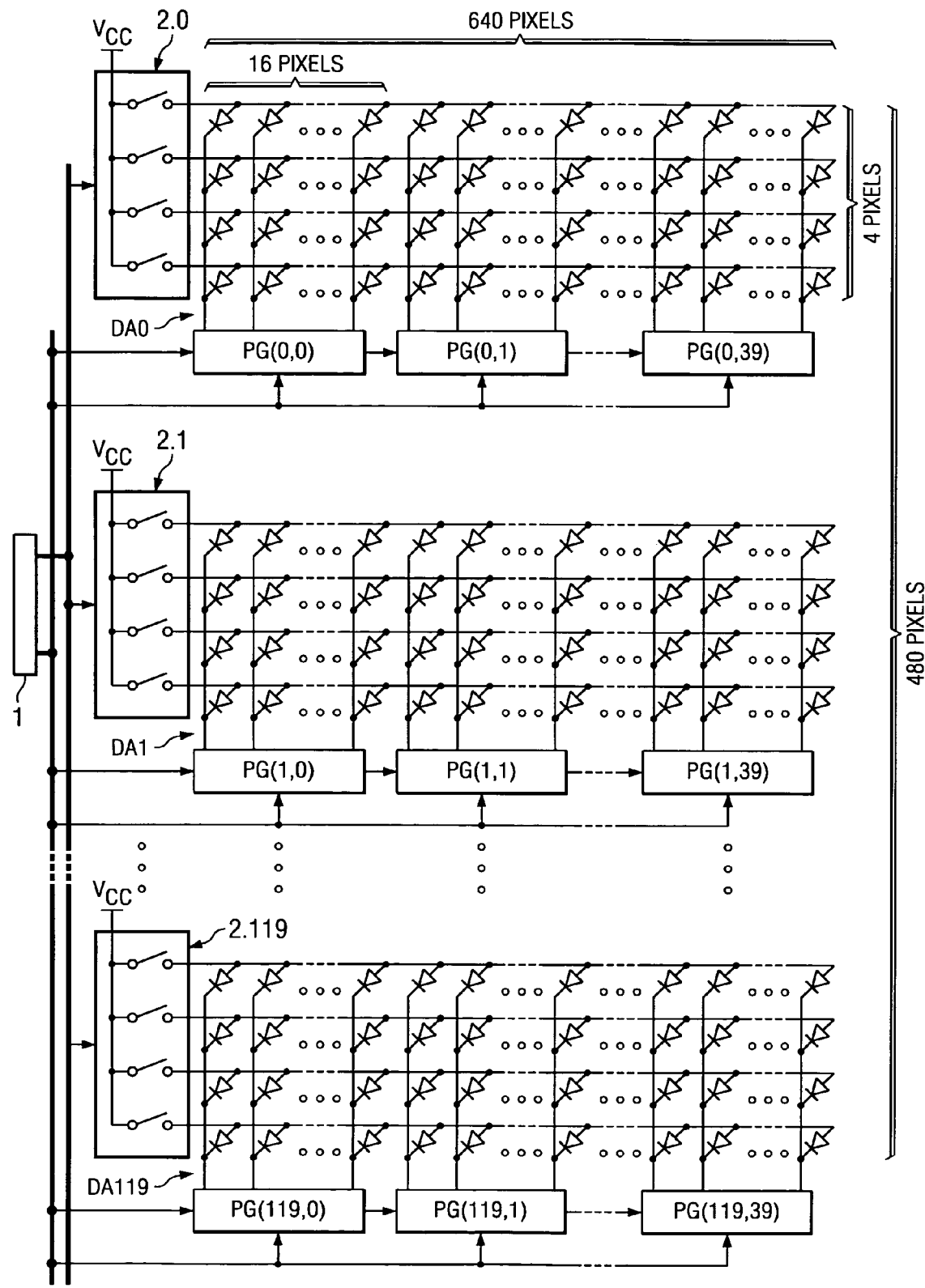
FIG. 1 is a block diagram illustrating an example of the constitution of the display device in Embodiment 1 of the present invention.

FIG. 1 is a block diagram illustrating an example of the constitution of the display device in Embodiment 1 of the present invention.

The display device shown in FIG. 1 includes control unit 1, horizontal line selection units 2_0–2_119, LED arrays DA0–DA119, and pulse signal generating units PG(0,0)–PG(119,39).

Control unit 1 is an embodiment of the control means of the present invention.

LED arrays DA0–DA119 are an embodiment of the display elements of the present invention.

Pulse signal generating units PG(0,0)–(119,39) are an embodiment of the pulse signal generators of the present invention.

Control unit 1 generates the control signals to be explained later for pulse signal generating units PG(0,0)–PG(119,39) on the basis of the information of the display image. With said control signals, the pulse width of the pulse signals for driving LEDs of LED arrays DA0–DA119 is controlled. Also, horizontal line selection units 2_0–2_119 generate control signals for controlling the time division selection operation of the horizontal lines.

Horizontal line selecting units 2_0–2_119 are connected to four horizontal lines of LED arrays DA0–DA119, respectively. Corresponding to the control signal from control unit 1, one horizontal line is selected from said four horizontal lines, and it is connected to power source line Vcc.

The four horizontal lines are selected in a quarter period of the pulse signal fed to LED and are respectively connected to power source line Vcc. As a result, the four LEDs connected to the output channels of pulse signal generating units PG(0,0)–PG(119,39) are driven in time-division fashion.

LED arrays DA0–DA119 each comprise 640×4 LEDs connected to four horizontal lines and 640 vertical lines. The anode terminals of 640 LEDs are respectively connected to said horizontal lines, and the cathode terminals of four LEDs are respectively connected to the vertical lines.

The size of the image displayed by each of LED arrays DA0–DA119 is 640×480 pixels.

Such pulse signal generating units PG(0,0)–PG(119,39) has 16 pulse signal channels. The pulse signals for driving LEDs are output from these output channels. As shown in FIG. 1, the output channels of pulse signal generating units PG(i,0)–PG(i,39) are respectively connected to the 640 vertical lines of LED array DAi. Here, i represents an integer from 0–119.

Figure 2:
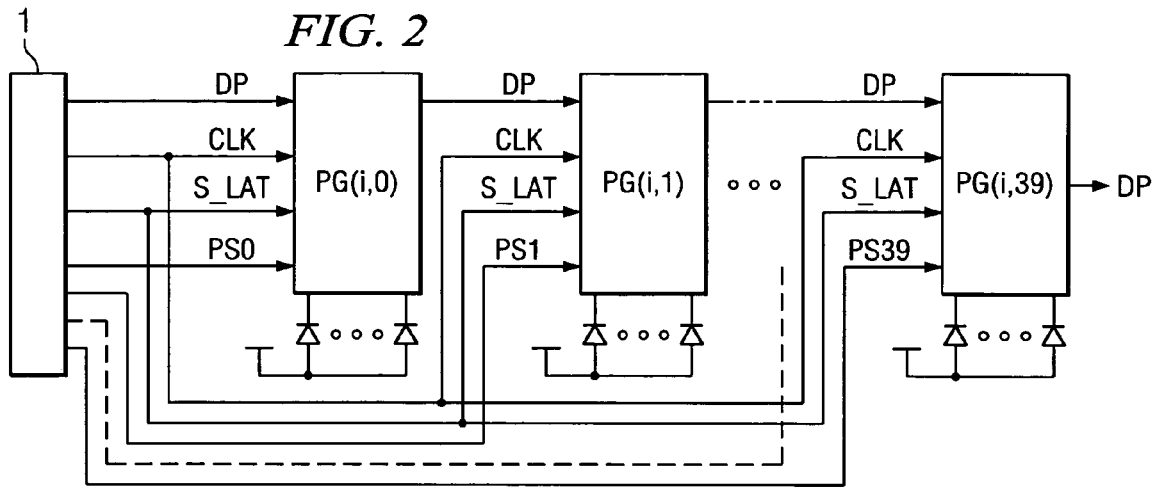
FIG. 2 is a block diagram illustrating the constitution corresponding to 1 horizontal line extracted from the display device pertaining to Embodiment 1 of the present invention.

FIG. 2 is a block diagram illustrating the constitution of 1 horizontal line extracted from the display device in Embodiment 1 of the present invention. The same part numbers are used in FIGS. 1 and 2. Also, in FIG. 2, only one of the four LEDs connected to each output channel of pulse signal generating units PG(i,0)–PG(i,39) is shown, while the other three are omitted.

Each pulse signal generating unit PG(i,j) has clock signal CLK, latch signal S_LAT, and pulse string PSj output from control unit 1. Here, j represents an integer from 0–39.

Also, pulse signal generating unit PG(i,j) takes pulse assignment signal DP output from control unit 1 or previous-stage pulse signal generating unit PG(i,j−1) as an input, and holds input pulse assignment signal DP synchronously with clock signal CLK, while outputting it to next-stage pulse signal generating unit PG(i,j+1).

That is, as shown in FIG. 2, pulse signal generating units PG(i,0)–PG(i,39) are connected in cascade via the input/output terminals of pulse assignment signal DP. Pulse assignment signal DP output as a serial signal from control unit 1 is input to initial-stage pulse signal generating unit PG(i,0), and pulse assignment signal DP output from the former stage is input to the corresponding next-stage pulse signal generator after the initial stage.

Pulse assignment signals DP[0]–DP[39] sent from control unit 1 to pulse signal generating units PG(i,0)–PG(i,39) are sequentially output as serial signals from control unit 1 in the order of DP[39], . . . DP[0], and they are sequentially transmitted to the pulse signal generators connected in cascade. Then, as pulse assignment signals DP[39], . . . DP[0] arrive at pulse signal generating units PG(i,39), . . . PG(i,0), the pulse assignment signals are retrieved from the various pulse signal generators.

Control unit 1 outputs clock signal CLK and latch signal S_LAT to all pulse signal generating units PG(i,0)–PG(i,39). Also, pulse strings PS0–PS39 are respectively output to pulse signal generating units PG(i,0)–PG(i,39). In addition, synchronously with clock signal CLK, pulse assignment signals DP are output to initial-stage pulse signal generating unit PG(i,0) in the order of DP[39], . . . DP[0].

Figure 3:
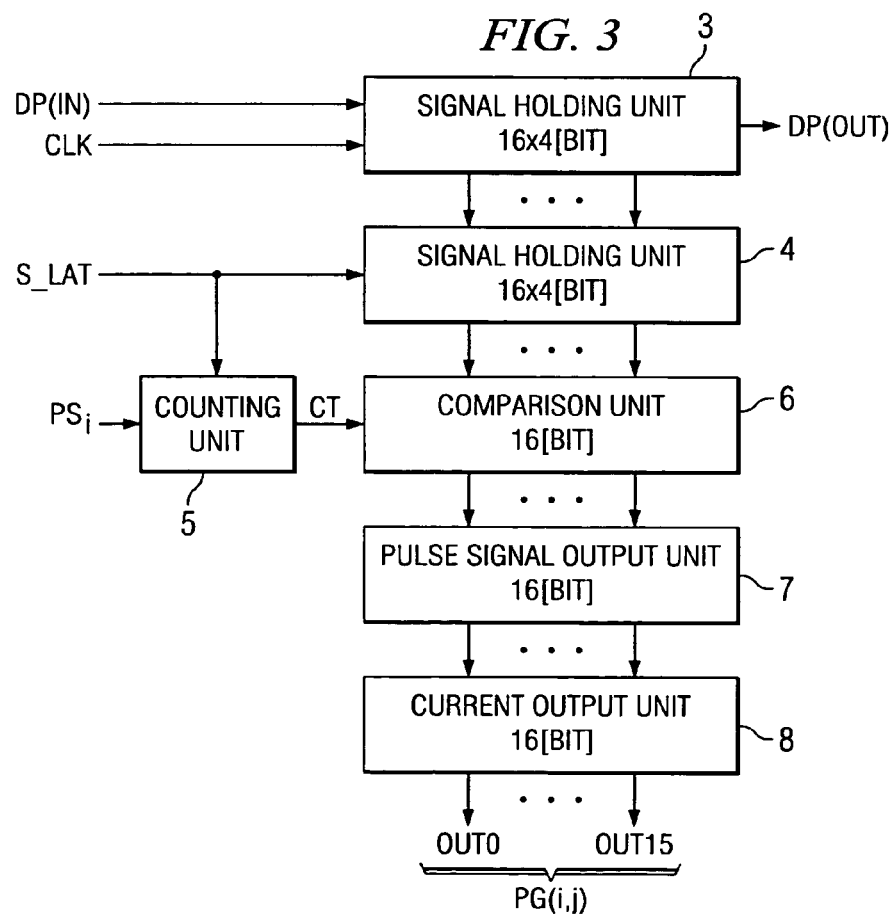
FIG. 3 is a block diagram illustrating an example of the constitution of the pulse signal generating unit pertaining to Embodiment 1 of the present invention.

FIG. 3 is a block diagram illustrating an example of the constitution of pulse signal generating units PG(i,j) pertaining to Embodiment 1 of the present invention.

Each pulse signal generating unit PG(i,j) shown in FIG. 3 has signal holding units 3 and 4, counting unit 5, comparison unit 6, pulse signal output unit 7, and current output unit 8.

Signal holding unit 3 corresponds to an embodiment of the second signal holding means of the present invention.

Signal holding unit 4 corresponds to an embodiment of the third signal holding means of the present invention.

Counting unit 5 corresponds to an embodiment of the pulse arrival notification means of the present invention.

Comparison unit 6 corresponds to an embodiment of the pulse arrival judgment means of the present invention.

Signal holding unit 3 receives and holds pulse assignment signal DP of 64 bits (4bits×16 channels) output from previous-stage pulse signal generating unit PG(i,j−1) or control unit 1 synchronously with clock signal CLK. Also, the held pulse assignment signal DP is output to next-stage pulse signal generating unit PG(i,j+1).

For example, if pulse assignment signal DP is input/output as a 1-bit serial signal, signal holding unit 3 is composed of a 64-bit shift register.

Signal holding unit 4 holds 64-bit pulse assignment signal DP held in signal holding unit 3 synchronously with latch signal S_LAT output from control unit 1.

Counting unit 5 counts the pulses of pulse string PSj output from control unit 1, and outputs count CT to comparison unit 6. Also, count CT is initialized synchronously with latch signal S_LAT output from control unit 1.

As an example, suppose counting unit 5 is composed of a 4-bit counter. When high-level latch signal S_LAT is received, count CT is initialized to "15" (or "1111" in binary representation). As a result, after count CT is initialized to "15," at the time pulse string PSj counts the initial pulse, count CT of counting unit 5 becomes "0."

From 64-bit pulse assignment signal DP held in signal holding unit 4, comparison unit 6 gets the corresponding 4-bit pulse assignment signals in the 16 output channels, respectively. Then, the value of the pulse assignment signal of each output channel obtained as described above and count CT of counting unit 5 are compared. For example, if count CT is smaller than the value of the pulse assignment signal, a comparison result signal with value "1" is output to the output channel. On the other hand, if count CT is less than or equal to the value of the pulse assignment signal, a comparison result signal with value "0" is output to the output channel.

Pulse signal output unit 7 is a unit that outputs the pulse signals of 16 channels for driving LEDs to current output unit 8.

Corresponding to the comparison result in comparison unit 6, pulse signal output unit 7 inverts the output level (high level or low level) of each pulse signal supplied to current output unit 8. For example, if the comparison result signal from comparison unit 6 is "1," a high-level pulse signal is output. On the other hand, if the comparison result signal is "0," a low-level pulse signal is output. When the comparison result signal changes from "0" to "1," the output level of the pulse signal is inverted from the low level to the high level. On the other hand, when the comparison result signal changes from "1" to "0," the output level of the pulse signal is inverted from the high level to the low level.

Current output unit 8 is a unit for outputting current to each LED corresponding to the pulse signal output from pulse signal output unit 7.

For example, current output unit 8 outputs a prescribed constant current when the pulse signal output from pulse signal output unit 7 is at the high level, and it stops outputting constant current when the pulse signal output from pulse signal output unit 7 is at the low level. That is, current output unit 8 supplies a constant current to the corresponding LED when a high-level pulse signal is output from pulse signal output unit 7, and it stops sourcing constant current to said LED when a low-level pulse signal is output from pulse signal output unit 7.

In the following, the operation of the display device with the aforementioned constitution will be explained with reference to the timing diagram shown in FIGS. 4 and 5.

Figure 4:
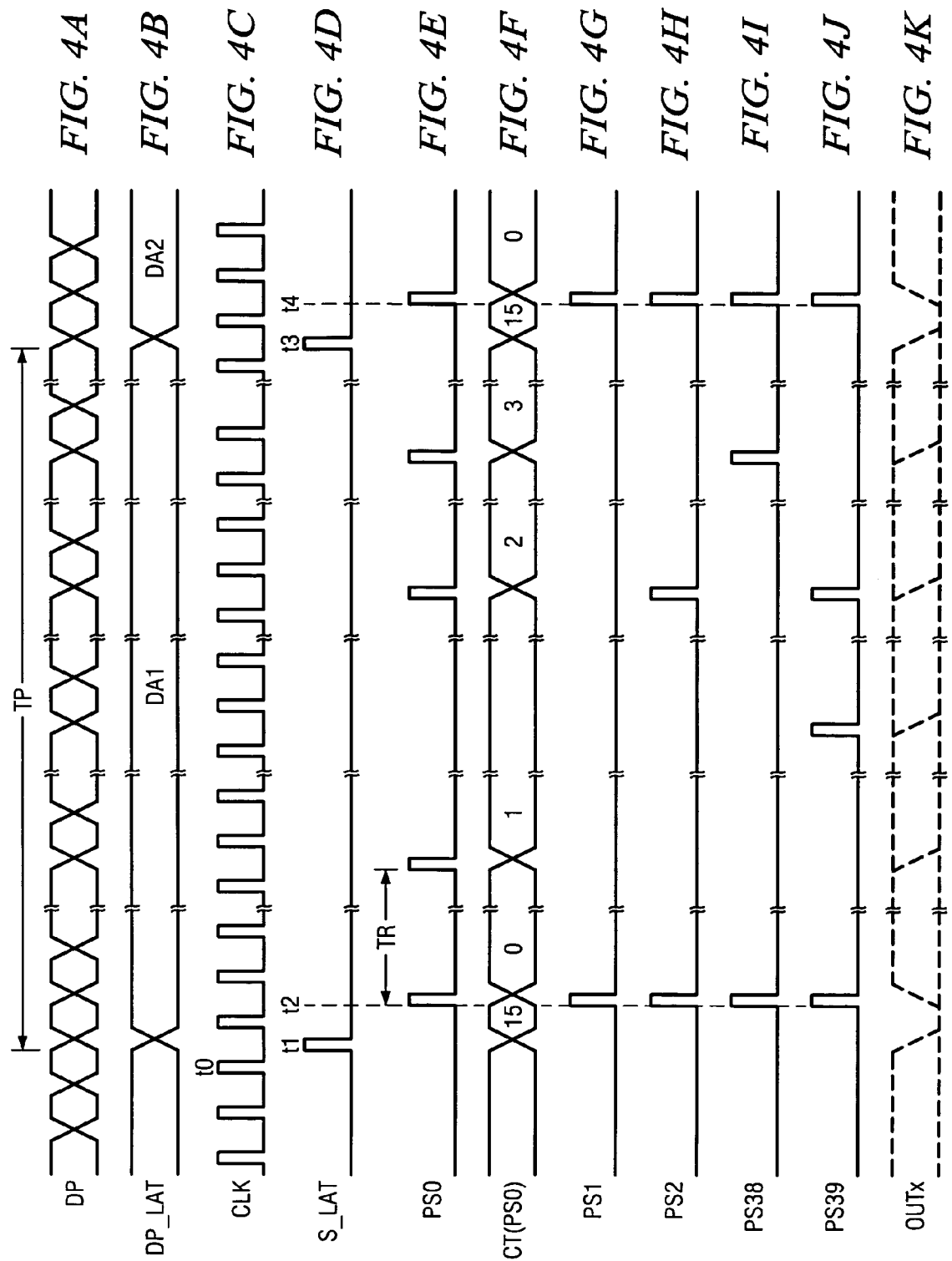
FIG. 4 is a timing diagram illustrating an example of the timing relationship between various signals in the display device shown in FIG. 2.

FIG. 4 is a timing diagram illustrating an example of the timing relationship of the various signals of the display device shown in FIG. 2.

FIG. 4(A) is a diagram illustrating the pulse assignment signal output from control unit 1.

FIG. 4(B) is a diagram illustrating the pulse assignment signal held in signal holding unit 4 of pulse signal generating unit PG(i,j).

FIG. 4(C) is a diagram illustrating clock signal CLK output from control unit 1.

FIG. 4(D) is a diagram illustrating latch signal S_LAT output from control unit 1.

FIG. 4(E) is a diagram illustrating pulse string PS0 output from control unit 1 to pulse signal generating unit PG(i,0).

FIG. 4(F) is a diagram illustrating count CT of counting unit 5 in pulse signal generating unit PG(i,0).

FIGS. 4(G)–(J) illustrate pulse string PSj output from control unit 1 to pulse signal generating units PG(i,1)–PG(i,39).

FIG. 4(K) is a diagram illustrating the pulse currents output from the output channels of pulse signal generating units PG(i,0)–PG(i,39).

As shown in FIG. 4, the period of latch signal S_LAT (FIG. 4(D)) is set to period Tp by control unit 1, and synchronously with this latch signal S_LAT, the pulse assignment signal held in signal holding unit 3 is sent to signal holding unit 4.

During the period from the execution of signal holding in signal holding unit 4 to the execution of next signal holding in signal holding unit 4, control unit 1 generates new pulse assignment signals for setting the desired pulse width of the pulse signals of the output channels in the next cycle, and these pulse assignment signals are sequentially output to pulse signal generating units PG(i,0)–PG(i,39) (FIG. 4(A)). The pulse assignment signals output from control unit 1 are sequentially shifted in the various stages of the pulse signal generators connected to each other in cascade synchronously with clock signal CLK (FIG. 4(C)), and they are respectively transferred to the target pulse signal generators.

For example, the 64-bit pulse assignment signal "DA1" output from control unit 1 to pulse signal generating units PG(i,j) is sequentially shifted in pulse signal generating units PG(i,0)–PG(i,j−1) synchronously with clock signal CLK. At time to, it is held in signal holding unit 3 of pulse signal generating unit PG(i,j). Then, at time t1, it is held in signal holding unit 4 with the pulse of latch signal S_LAT (FIG. 4(B)). Signal "DA1" held in signal holding unit 4 is output to comparison unit 6 during the period from time t1 to time t3.

In this period (time t1–t3), new pulse assignment signals are generated by control unit 1 and are sequentially output to pulse signal generating units PG(i,0)–PG(i,39). The new pulse assignment signal "DA2" formed for pulse signal generating unit PG(i,j) is sequentially shifted in pulse signal generating units PG(i,0)–PG(i,j−1) and held in signal holding unit 3 of pulse signal generating unit PG(i,j). Pulse assignment signal "DA2" is held in signal holding unit 4 with the pulse of latch signal S_LAT at time t3 (FIG. 4(B)).

The pulse assignment signals for output of pulse signals with prescribed pulse width from the output channels are generated in control unit 1 during each period Tp and transferred to signal holding units 4 of pulse signal generating units PG(i,0)–PG(i,39), respectively.

On the other hand, in counting unit 5, count CT is initialized to "15" synchronously with latch signal S_LAT (FIG. 4(D)). Because the maximum value of the 4-bit pulse assignment signal is "15," as count CT of counting unit 5 is initialized to "15," the comparison result signals of comparison unit 6 all become "0."

As shown in FIG. 4(F), with the pulse of latch signal S_LAT, count CT is initialized to "15" (times t1, t3). Then, as the initial pulse of pulse string PS0 (FIG. 4(E)) is counted by counting unit 5 (times t2, t4), count CT is reset to "0" from "15." In this case, in the output channel where said 4-bit pulse assignment signal is greater than "0," the comparison result signal becomes "1," and sourcing of a constant current to LED is started. On the other hand, in the output channel where the pulse assignment signal is "0," the comparison result signal remains at "0," while the output current to the LED remains off.

The pulses of pulse string PS0 are then input to counting unit 5 for counting. As the pulses are counted, the count CT is sequentially increased in the form of "1," "2," "3," . . . , and the output current is cut off in the output channel where the 4-bit pulse assignment signal is in agreement with said count CT.

In this way, the pulse width of the output channels of pulse signal generating units PG(i,0)–PG(i,39) is controlled corresponding to 4-bit pulse assignment signals DP[0]–DP[39] and pulse strings PS0–PS39 transferred from control unit 1.

However, as shown in FIGS. 4(E) and 4(G)–(J), the pulse interval of pulse string PSj generated in control unit 1 may not necessarily be constant. This is due to the fact that the pulse interval of pulse string PSj is controlled by control unit 1 in such a way that the prescribed pulse width is realized for the pulse signal in each output channel.

In the following, the control of the pulse interval of pulse string PSj by control unit 1 will be explained with reference to FIG. 5.

FIG. 5(A) is a diagram illustrating an example of grayscale clock signal GSCLK that determines the gray scale, that is, the resolution of the pulse width of the pulse signals generated by pulse signal generating units PG(i,0)–PG(i,39). Here, grayscale clock signal GSCLK is an internal signal of control unit 1.

Pulse string PSj generated by control unit 1 can be taken as a pulse string generated by selecting certain clock pulses from the clock pulses of grayscale clock signal GSCLK shown in FIG. 5(A) such that the desired pulse width is realized for the pulse signals of the output channels in the pulse signal generators.

For example, pulse string PSj shown in FIG. 5(B) is a pulse string generated by selecting 16 pulses (0, 2, 3, 101–103, 105–110, 251–253, and 255$^{th}$ pulses) from the 256 pulses of grayscale clock signal GSCLK (FIG. 5(A)). Values "0" to "15" of the 4-bit pulse assignment signals transferred from control unit 1 correspond to the 16 pulses, respectively.

As shown in FIGS. 5(D)–(R), the pulse signals in output channels "1" to "15" go to the high level synchronously with the leading pulse (0$^{th}$ pulse) of pulse string PSj and go to the low level synchronously with pulse string PSj input sequentially corresponding to the value of the pulse assignment signal.

For example, suppose the pulse assignment signal given to output channel "10" has a value of "6," the pulse signal (FIG. 5(M)) is at the high level during the period from the leading pulse to the 6$^{th}$ pulse of pulse string PSj, and it is inverted from the high level to the low level synchronously with the 6$^{th}$ pulse. That is, the pulse assignment signal is a signal used to assign the time of level inversion of the output pulse signal from the various pulses of the input pulse string PSj. The 6$^{th}$ pulse of pulse string PSj corresponds to the 105$^{th}$ pulse counted from the leading pulse of grayscale clock signal GSCLK. Consequently, the pulse signal of output channel "10" has a pulse width corresponding to "105" of the 256 levels (0–255).

Also, since the pulse assignment signal sent to output channel "0" has a value of "0," the pulse signal (FIG. 5(C)) remains at the low level from the leading pulse (0$^{th}$ pulse) of pulse string PSj. In this case, the pulse signal of output channel "0" has a pulse width corresponding to "0" of the 256 levels (0–255).

Figure 5:
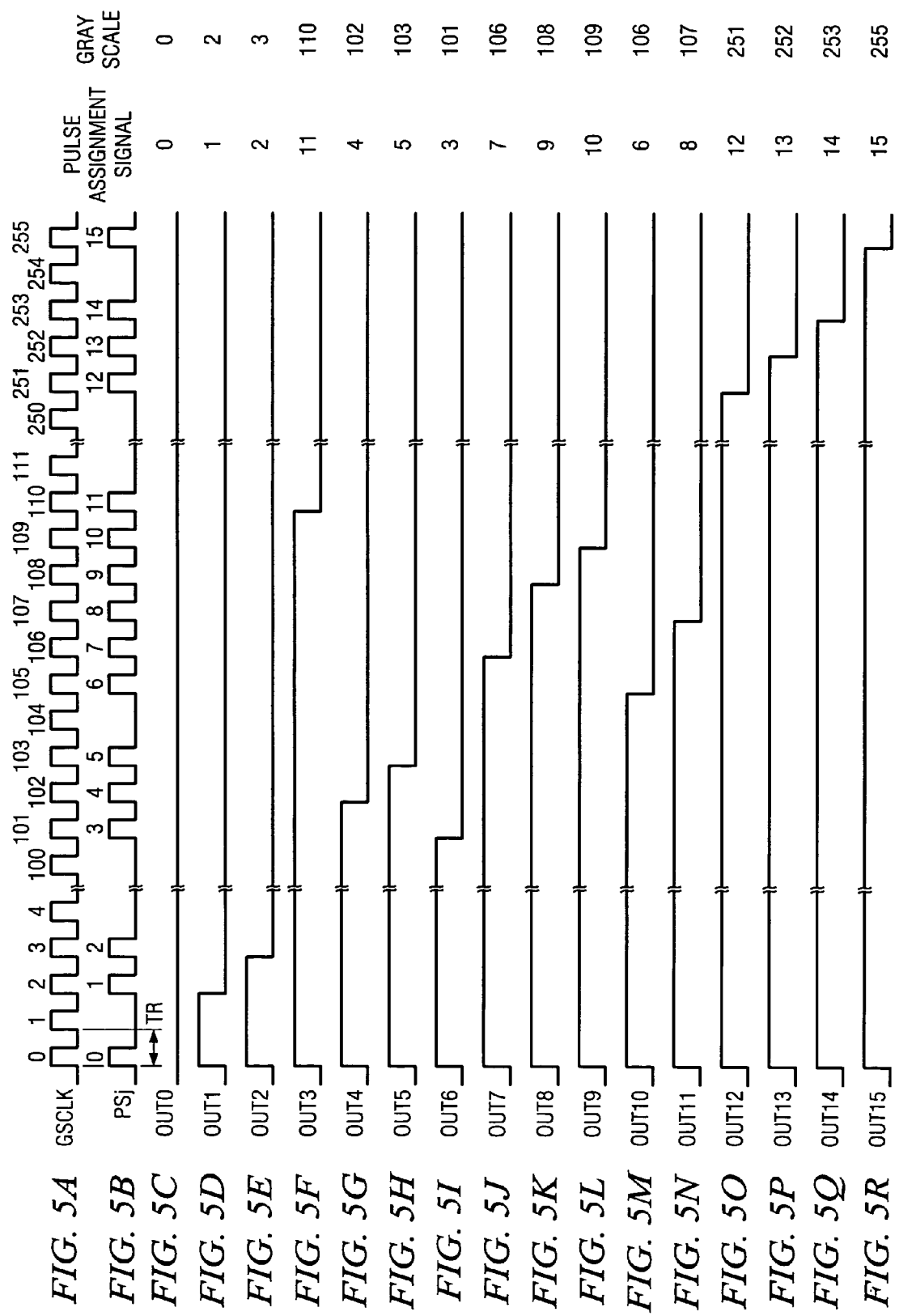
FIG. 5 is a timing diagram illustrating an example of the timing relationship between the pulse string supplied from the control unit to the pulse signal generating units and the pulse signals of the various output channels.

In the example shown in FIG. 5, pulse assignment signals with different values are sent to the 16 output channels. However, it is also possible to send pulse assignment signals having the same value to plural output channels. In this case, the pulse signals of the output channels have the same pulse width.

Figure 18:
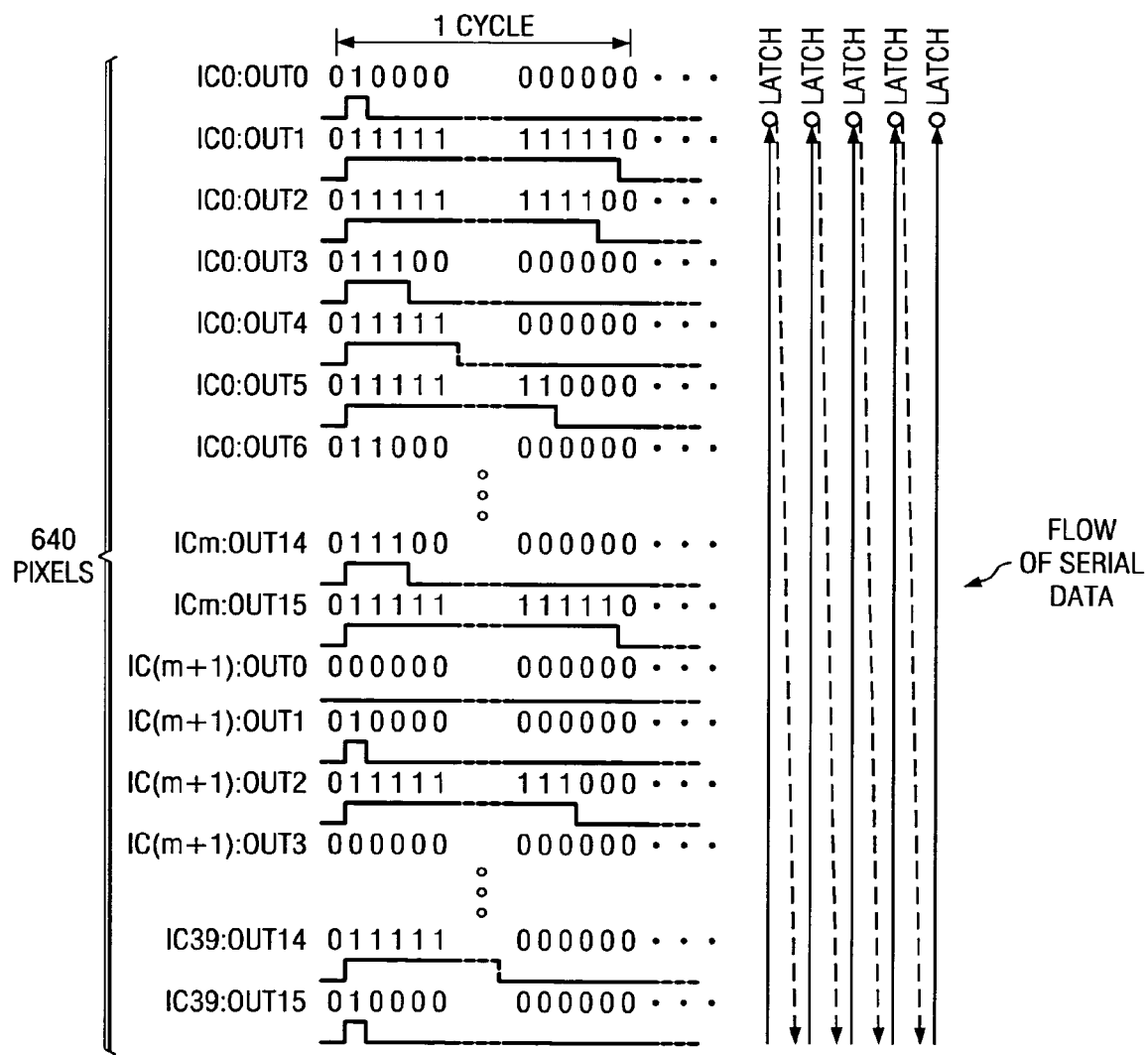
FIG. 18 is a diagram illustrating the bit values of the on/off control signal set corresponding to the output terminals of the LED driver and the current waveforms flowing from various output terminals to LEDs in the LED display device shown in FIG. 17.
Figure 19:
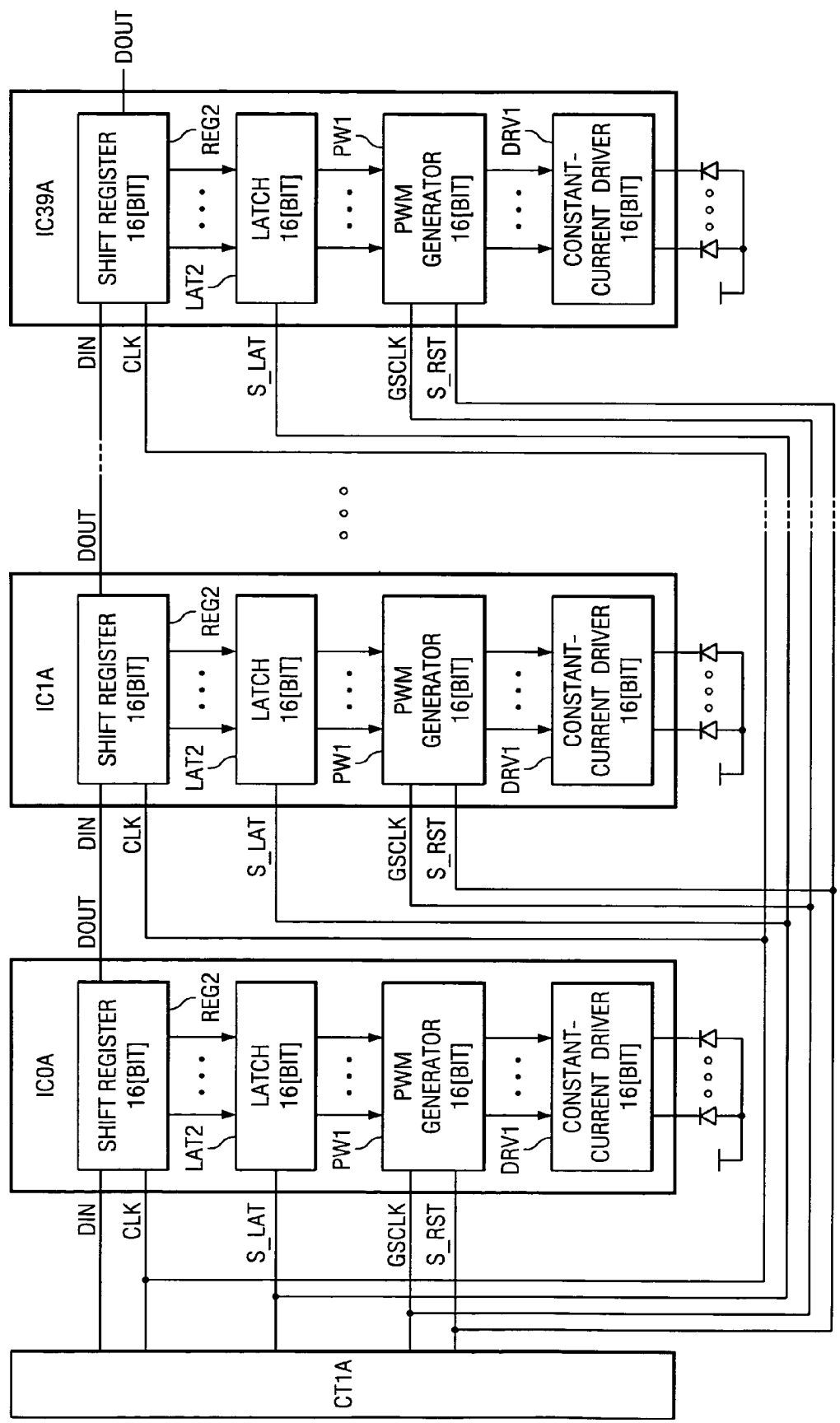
FIG. 19 is a block diagram illustrating a portion of the constitution of the LED display device made of a PWM grayscale control type LED driver.

As explained above, the pulse width of each output channel is controlled by the 4-bit pulse assignment signal sent from control unit 1 and the pulse interval (pulse timing) of pulse string PSj. Consequently, compared to the display device shown in FIG. 18 that is set only with 8-bit pulse assignment signal with pulse width of 256 levels, in this case, the data duration of the control signal handled in the pulse signal generator can be halved. This is due to the fact that, by means of control of the pulse interval (pulse timing) of pulse string PSj corresponding to the desired pulse width, the quantity of information sent as pulse assignment signal to pulse signal generating units PG(i,0)–PG(i,39) can be reduced.

Since the data duration of the pulse assignment signal (pulse width setting signal) is halved, it is possible to use a simpler circuit constitution for signal holding unit 3, signal holding unit 4, counting unit 5 and comparison unit 6 in pulse signal generating units PG(i,0)–PG(i,39). As a result, the circuit scale can be made considerably smaller.

Figure 16:
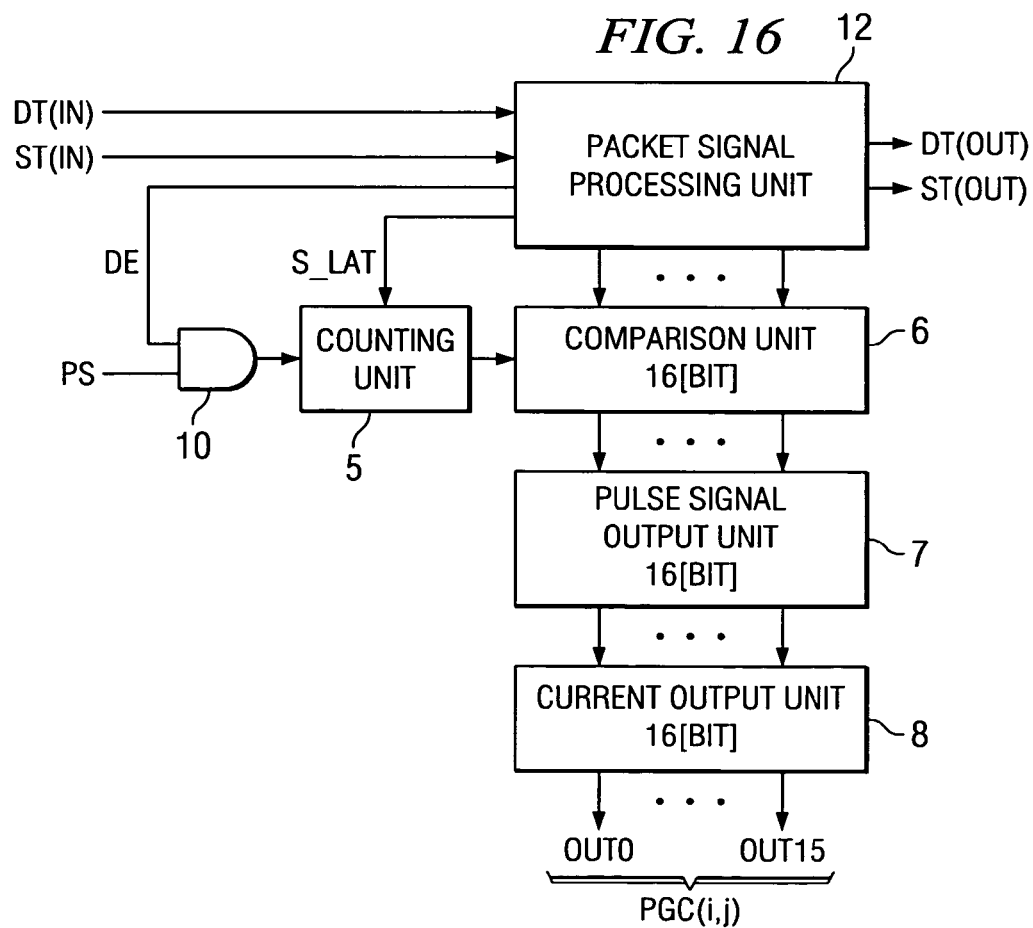
FIG. 16 is a block diagram illustrating an example of the constitution of the pulse signal generating unit in Embodiment 6 of the present invention.
Figure 17:
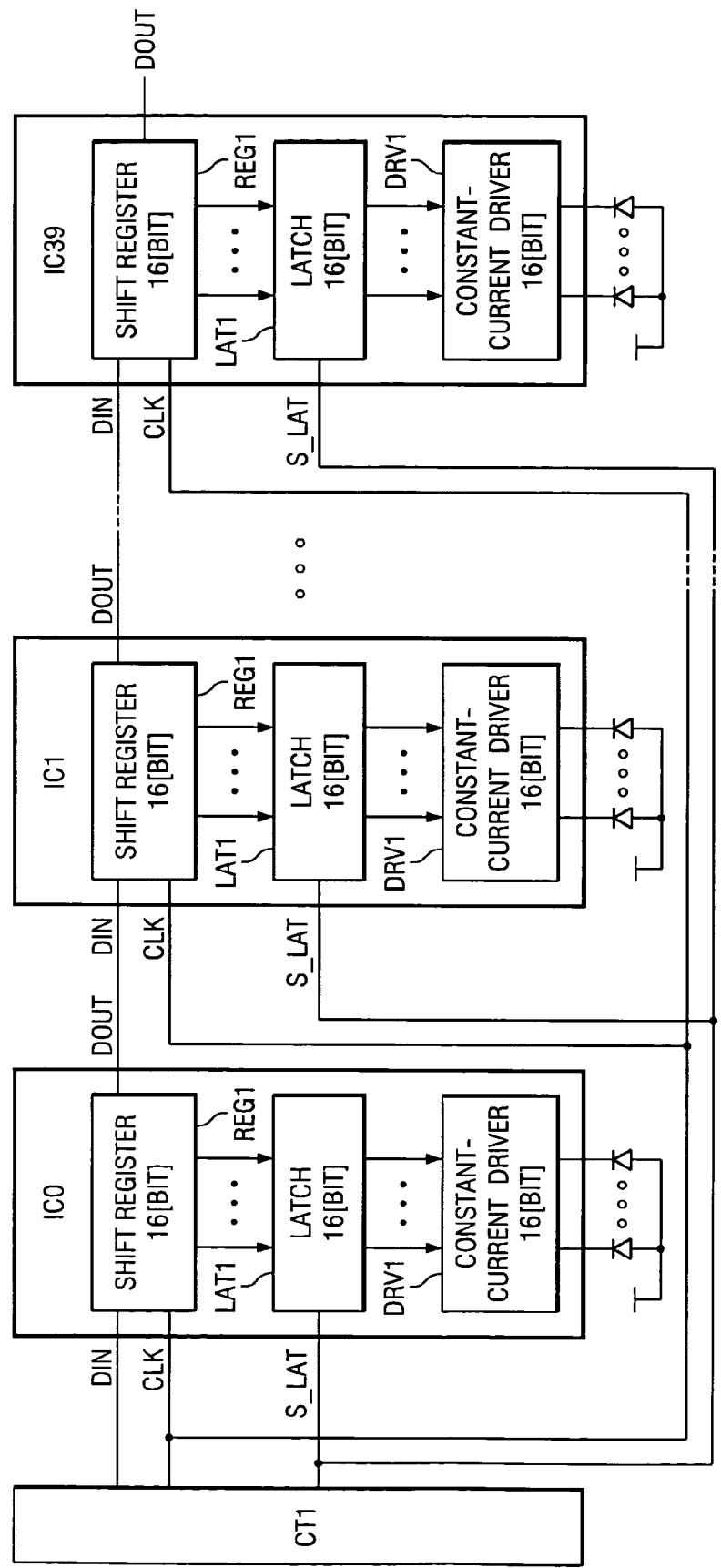
FIG. 17 is a block diagram illustrating a portion of the constitution of the LED display device made up of a single-grayscale type LED driver.

Also, when compared to the display device shown in FIG. 16, it is possible to significantly reduce the frequency of clock signal CLK for setting the pulse width with respect to pulse signal generating units PG(i,0)–PG(i,39).

For example, under the same conditions as Equation 1 (a refresh rate of 200, 4 time divisions), frequency fmax3a of clock signal CLK can be founded by the following equation.

[Mathematical Formula 4]

$$f\max 3a = 200[\text{r.r}] \times 4[\text{duty}] \times 640[\text{pixel}] \times 4[\text{bit}] \quad (4)$$
$$= 2.0[\text{MHz}]$$

Also, frequency fmax3b of pulse string PSj becomes the following equation.

[Mathematical Formula 5]

$$f\max 3b = 200[\text{r.r.}] \times 4[\text{duty}] \times 256[\text{GS}] \quad (5)$$
$$= 205[\text{kHz}]$$

Consequently, even for a device as large as several meters square, as long as the signal has a frequency near that found by Equation 4, it is possible to provide a stable pulse assignment signal to the pulse signal generators.

Embodiment 2

Embodiment 2 of the present invention will be explained below.

In the display device in Embodiment 2, for example, control unit 1 and pulse signal generating units PG(i,j) in the display device shown in FIG. 1 are replaced by control unit 1A and pulse signal generating units PGA(i,j), to be explained below.

Figure 6:
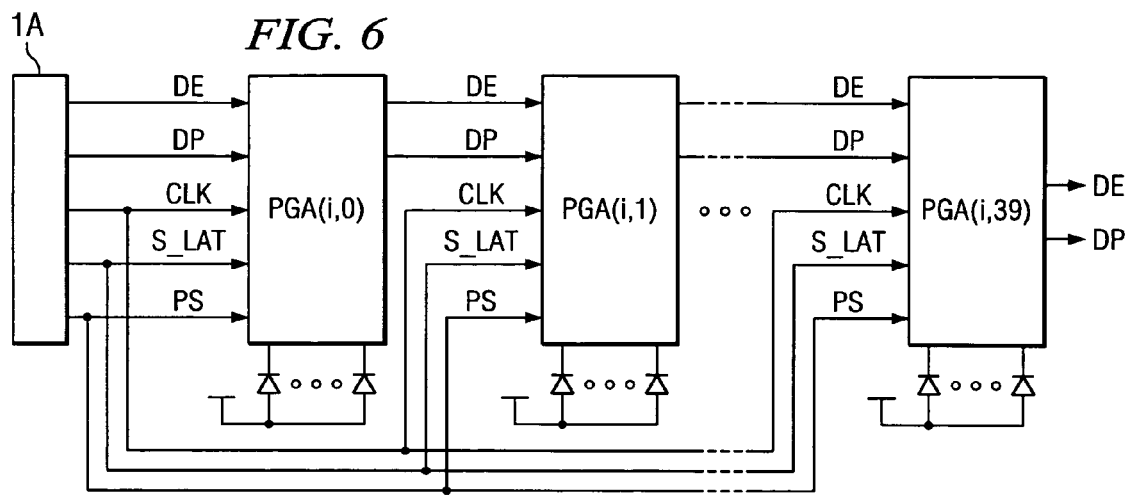
FIG. 6 is a block diagram illustrating the constitution of 1 horizontal line extracted from the display device pertaining to Embodiment 2 of the present invention.

FIG. 6 is a block diagram illustrating the constitution of a horizontal line extracted from the display device in Embodiment 2 of the present invention.

Clock signal CLK output from control unit 1A, latch signal S_LAT, and pulse string PS are input to pulse signal generating unit PGA(i,j).

Also, pulse signal generating unit PGA(i,j) takes enable signal DE and pulse assignment signal DP output from previous-stage pulse signal generating unit PGA(i,j–1) as input, and holds input enable signal DE and pulse assignment signal DP synchronously with clock signal CLK, while outputting it to next-stage pulse signal generating unit PGA(i,j+1).

That is, pulse signal generating units PGA(i,0)–PGA(i,39) are connected in cascade via the input/output terminals of enable signal DE and pulse assignment signal DP. Enable signal DE and pulse assignment signal DP are output as serial signals from control unit 1A and input to initial-stage pulse signal generating unit PGA(i,0), and enable signal DE and pulse assignment signal DP output from the previous stage are input to the corresponding next-stage pulse signal generator after the initial stage.

Control unit 1A outputs clock signal CLK, latch signal S_LAT and pulse string PS to all of pulse signal generating units PGA(i,0)–PGA(i,39).

Also, enable signal DE and pulse assignment signal DP are output as serial signals to initial-stage pulse signal generating unit PGA(i,0) synchronously with clock signal CLK. That is, enable signals DE[0]–DE[39] and pulse assignment signals DP[0]–DP[39] sent to pulse signal generating units PGA(i,0)–PGA(i,39) are output in the order of DP[39], . . . DE[0], DP[39], . . . DE[0].

Figure 7:
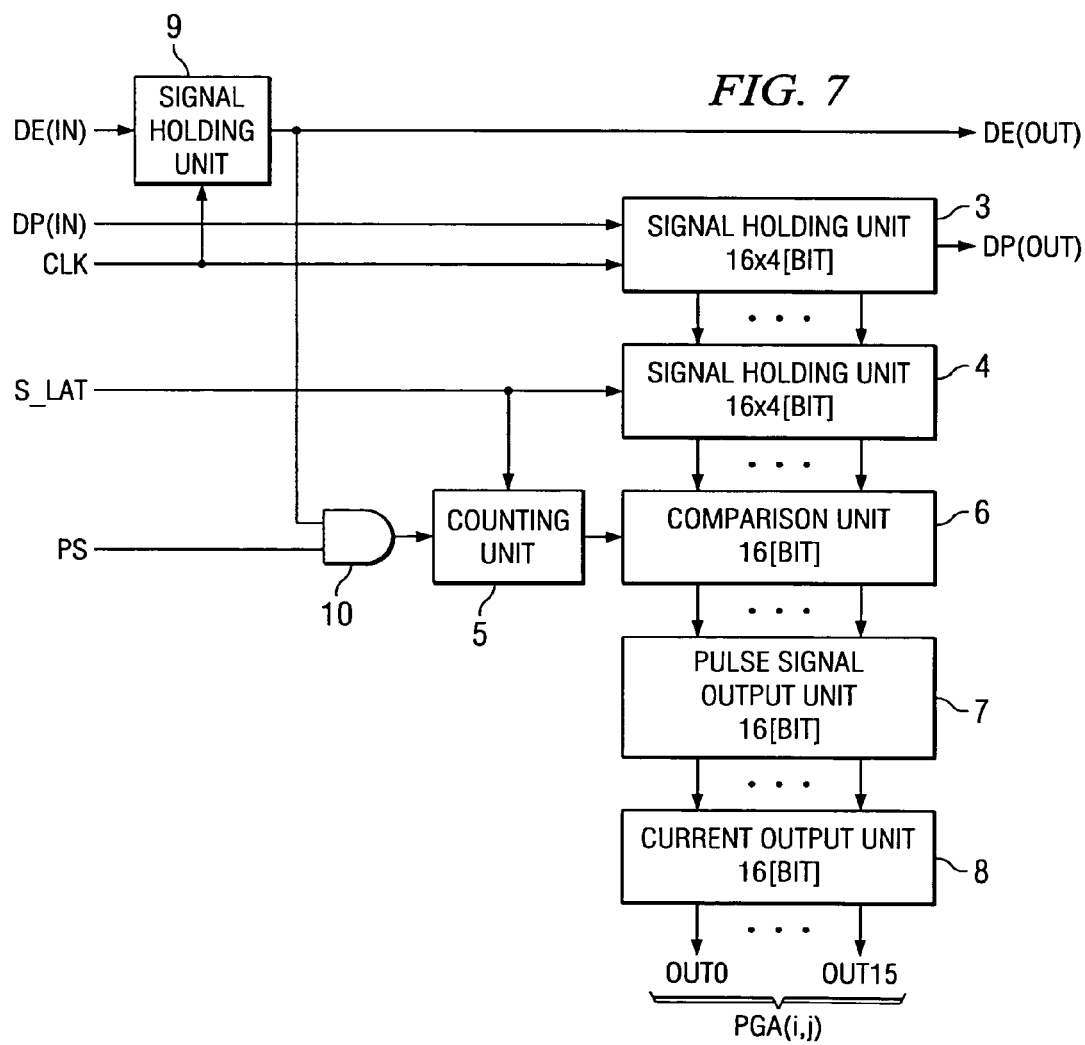
FIG. 7 is a block diagram illustrating an example of the constitution of the pulse signal generating unit pertaining to Embodiment 2 of the present invention.

FIG. 7 is a block diagram illustrating an example of the constitution of pulse signal generating unit PGA(i,j) pertaining to Embodiment 2 of the present invention. The same symbols in FIGS. 3 and 7 represent the same constituent elements.

As shown in FIG. 7, pulse signal generating unit PGA(i,j) has the same constitution as pulse signal generating unit PG(i,j) shown in FIG. 3, and it also has signal holding unit 9 and AND-gate 10.

Signal holding unit 9 corresponds to an embodiment of the first signal holding means of the present invention.

Signal holding unit 9 holds 1-bit enable signal DE output from previous-stage pulse signal generating unit PG(i,j–1) or control unit 1 synchronously with clock signal CLK. Also, it outputs the held enable signal DE to next-stage pulse signal generating unit PG(i,j+1).

AND-gate 10 forms the logical product of enable signal DE held in signal holding unit 9 and pulse string PS, and outputs the result to counting unit 5.

Counting unit 5 counts the pulses in pulse string PS that are input during the period when high-level enable signal DE(j+1) is held in signal holding unit 9.

The operation of the display device with the aforementioned constitution will be explained below with reference to the timing diagram shown in FIG. 8.

Figure 8:
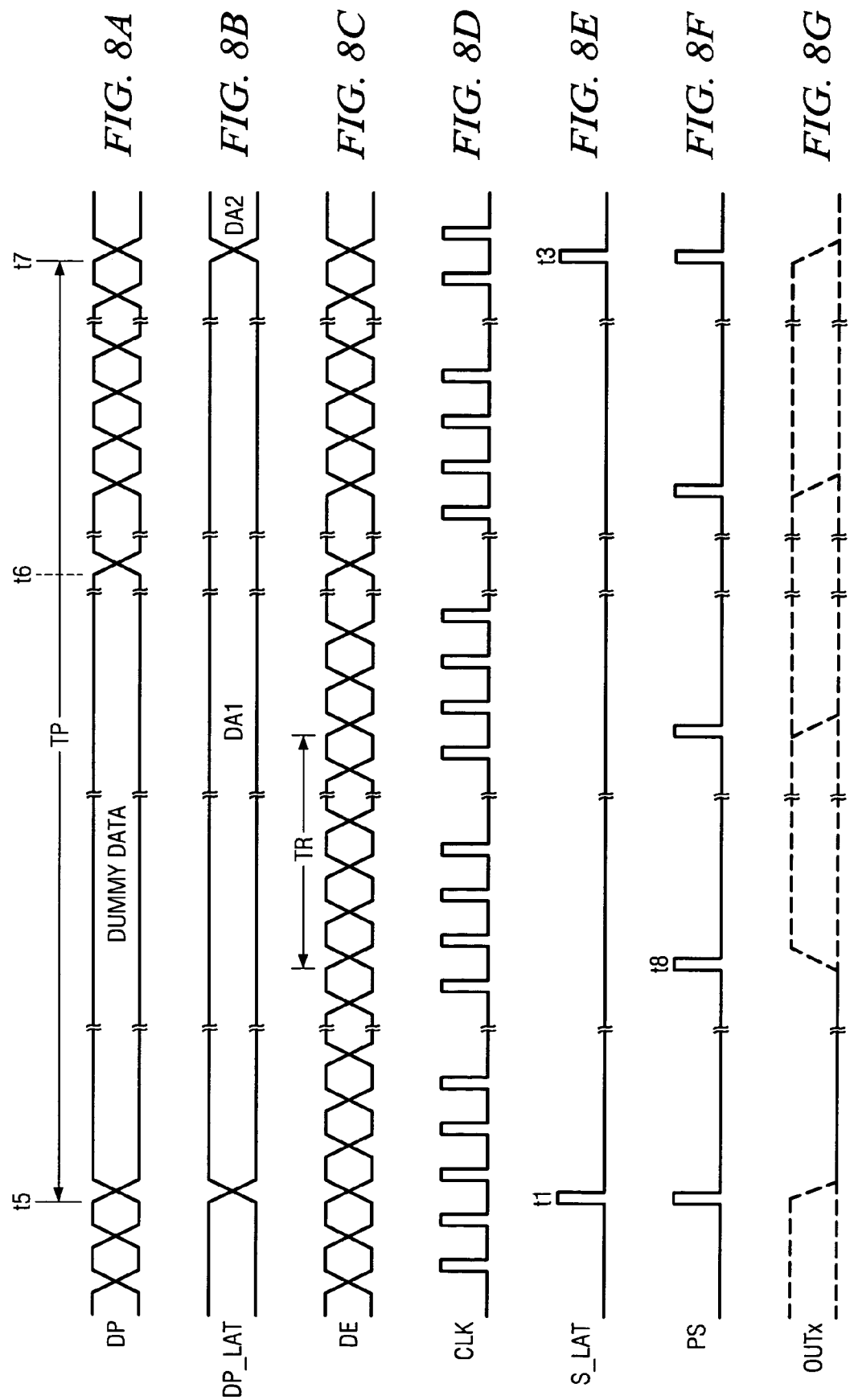
FIG. 8 is a timing diagram illustrating the timing relationship between the various signals in the display device shown in FIG. 6 in Embodiment 2.

FIG. 8 is a timing diagram illustrating an example of the timing relationship of the various signals of the display device shown in FIG. 6.

FIG. 8(A) is a diagram illustrating signals output from control unit 1A.

FIG. 8(B) is a diagram illustrating the pulse assignment signal held in signal holding unit 4 of pulse signal generating unit PGA(i,j).

FIG. 8(C) is a diagram illustrating enable signal DE output from control unit 1A.

FIG. 8(D) is a diagram illustrating clock signal CLK output from control unit 1A.

FIG. 8(E) is a diagram illustrating latch signal S_LAT output from control unit FIG. 8(F) is a diagram illustrating pulse string PS output from control unit 1A.

FIG. 8(G) illustrate the pulse currents output from the output channels of pulse signal generating units PGA(i,0)–PGA(i,39).

As shown in FIG. 8, the period of latch signal S_LAT (FIG. 8(E)) is set to period Tp by control unit 1A, and, synchronously with this latch signal S_LAT, the pulse assignment signal held in signal holding unit 3 is held in signal holding unit 4.

During the period from the execution of signal holding in signal holding unit 4 to the execution of signal holding in next signal holding unit 4, control unit 1A generates new pulse assignment signals for setting the desired pulse width in the pulse signals of the output channels in the next cycle, and these pulse assignment signals are sequentially output to pulse signal generating units PGA(i,0)–PGA(i,39) (FIG. 8(A)). The output pulse assignment signals are sequentially shifted in the various stages of the pulse signal generators connected to each other in cascade synchronously with clock signal CLK (FIG. 8(D)) and transferred to the respective target pulse signal generators.

For example, the 64-bit pulse assignment signal "DA1" output from control unit 1A to pulse signal generating unit PGA(i,j) is sequentially shifted in signal holding units 3 of pulse signal generating units PGA(i,0)–PGA(i,j) synchronously with clock signal CLK. At time t1, it is held in signal holding unit 4 of pulse signal generating unit PGA(i,j) by means of the pulse of latch signal S_LAT. Signal "DA1" held in signal holding unit 4 is then output to comparison unit 6 during the period from time t1 to time t3 (FIG. 4(B)).

During this period (time t1–t3), new pulse assignment signals are generated by control unit 1A and are sequentially output to respective pulse signal generating units PGA(i,0)–PGA(i,39).

The number of clock pulses in clock signal CLK during period Tp is greater than the overall bit length (640×4-bits) of the pulse assignment signal transferred to pulse signal generating units PGA(i,0)–PGA(i,39), as will be explained below. Consequently, during a portion of period Tp, dummy data unrelated to the pulse assignment signal held in signal holding unit 4 is output to control unit 1A.

For example, as shown in FIG. 8(A), of the signals output from control unit 1A, the signal output during the first half of period Tp (time t5–t6) is said dummy data unrelated to the pulse assignment signal, and the signal output in the second half of period Tp (time t6–t7) is the pulse assignment signal to be sent to the pulse signal generators.

New pulse assignment signal "DA2" generated for pulse signal generators PGA(i,j) is sequentially shifted in pulse signal generators PGA(i,0)–PGA(i,j−1) and held in signal holding unit 3 of pulse signal generator PGA(i,j). At time t3, held pulse assignment signal "DA2" is sent to signal holding unit 4 by means of the pulse of latch signal S_LAT (FIG. 8(B)). Also, when independent clock signals are used instead of common clock signals for the enable signal and pulse assignment signal, as shown in FIG. 8(A), there is no need to apply dummy data to the pulse assignment signal.

In this way, the pulse assignment signals for output of pulse signals with prescribed pulse width from the output channels are generated by control unit 1A during each period Tp and transferred to signal holding units 4 of pulse signal generating units PGA(i,0)–PGA(i,39), respectively.

On the other hand, the treatment of transfer of the enable signal from control unit 1A to pulse signal generators PGA(i,0)–PGA(i,39) is performed for each minimum pulse period Tr of pulse string PS. Pulse string PS is a pulse string corresponding to grayscale clock signal GSCLK shown in FIG. 5(A), and the minimum period Tr has a duration obtained by dividing period Tp of the pulse signal supplied to LED by the gray scale of 256.

As shown in FIG. 8(C), the enable signal output from control unit 1A is sequentially shifted in pulse signal generators PGA(i,0)–PGA(i,39) connected in cascade during the period Tr synchronously with clock signal CLK (FIG. 8(D)), and it is transferred one bit at a time to signal holding units 9, respectively.

During each period Tr, 1-bit enable signals are respectively output to pulse signal generators PGA(i,0)–PGA(i, 39). Consequently, during period Tp, the enable signal of 256×40 bits is output from control unit 1A.

Upon each completion of the transfer of the enable signal to pulse signal generators PGA(i,0)–PGA(i,39), that is, each period Tr, high-level pulses are output as pulse string PS from control unit 1A and input to AND-gate 10 of each pulse signal generator.

In this case, in the pulse signal generator where the enable signal with value of "1" is held in signal holding unit 9, the input pulse is input via AND-gate 10 to counting unit 5, and the count value of counting unit 5 is incremented. In the pulse signal generator where the enable signal with value of "0" is held in signal holding unit 9, the output value of AND-gate 10 remains at the high level and the count value of counting unit 5 is not incremented.

That is, in pulse signal generators PGA(i,0)–PGA(i,39), of the pulses of pulse string PS, the pulses that are input while the enable signal with value of "1" and indicating permission for pulse input are counted by counting unit 5.

For the pulse interval (pulse timing) of the pulse string input to counting units 5 of pulse signal generators PGA(i, 0)–PGA(i,39), by sending the enable signals individually to the respective pulse signal generators, it is possible to perform individual control. Consequently, it allows the same operation as that of the display device shown in FIG. 2, whereby individually generated pulse strings are sent to the respective pulse signal generators.

As explained above, in the display device shown in FIG. 6, like the display device shown in FIG. 2, it is possible to control the pulse interval (pulse timing) of the pulse string input to counting unit 5 of the respective pulse signal generators, corresponding to the desired pulse width of each output channel. Consequently, by adding only a few circuits (signal holding unit 9, AND-gate 10), the same operation as that of the display device shown in FIG. 2 can be performed, while the circuit scale can be greatly reduced compared to that of the display device shown in FIG. 18.

Also, for the display device shown in FIG. 6, 40 pulse strings (PS0–PS39) output from control unit 1 in the display device shown in FIG. 2 are replaced with a single common pulse string PS. Consequently, the number of circuit connections, and therefore the cost of the wiring, can be significantly reduced.

Also, the frequency of clock signal CLK for setting the pulse width in pulse signal generators PGA(i,0)–PGA(i,39) is used in the transfer of the enable signal. Consequently, although it is higher than the display device shown in FIG. 2, it still can be significantly reduced compared to the display device shown in FIG. 16.

For example, if the conditions are the same as those in Equation 1 (refresh rate of 200, 4 time divisions), frequency fmax4 of clock signal CLK of the display device shown in FIG. 6 can be found by the following equation.

[Mathematical Formula 6]

$$f\max 4 = 200[\text{r.r.}] \times 4[\text{duty}] \times 256[\text{GS}] \times 40[\text{IC}] \quad (6)$$

$$= 8.2[\text{MHz}]$$

Figure 9:
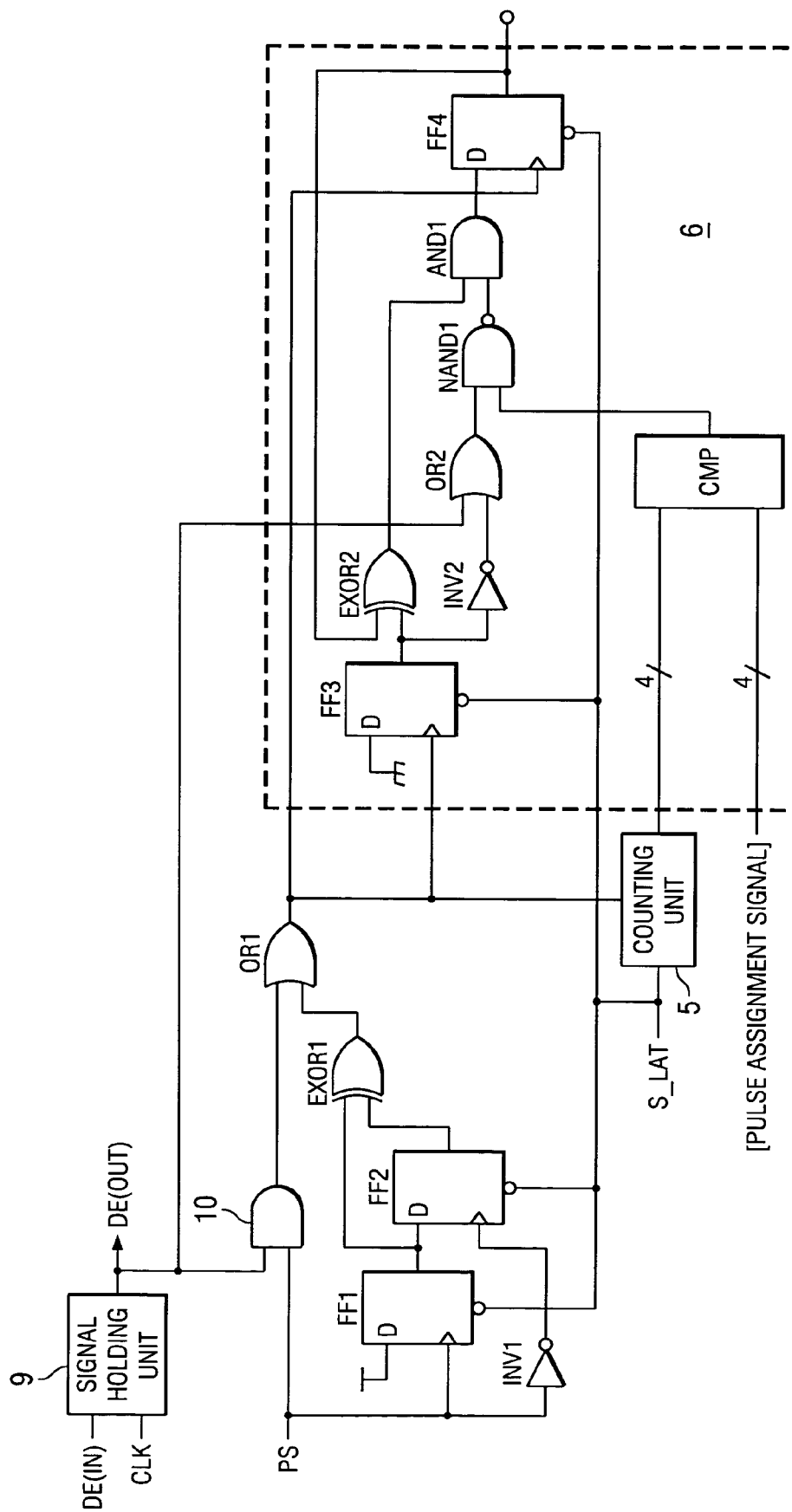
FIG. 9 is a block diagram illustrating the main portion of an embodiment variant of the pulse signal generating unit pertaining to Embodiment 2 of the present invention.

FIG. 9 is a block diagram illustrating the main portion of an embodiment variant of pulse signal generator PGA(i,j) pertaining to Embodiment 2 of the present invention.

In pulse signal generator PGA(i,j) shown in FIG. 7, counting unit 5 is reset by latch signal S_LAT, and, corresponding to the first pulse of pulse string PS, light emission of LEDs is initiated corresponding to the 16 outputs. Light emission of LEDs is then stopped. A detailed explanation follows.

When all of the 16 LEDs connected to pulse signal generator PGA(i,j) are turned on and off with different timings, the on/off control of these LEDs requires 17 pulses. Consequently, a 5-bit counter that can count to 17 is required for counting unit 5, and 5-bit data is required for pulse assignment signal DP. In this embodiment variant, however, the aforementioned operation can be realized using a 4-bit counter and 4-bit pulse assignment signals.

In this case, counting unit 5 is reset to 15 by latch signal S_LAT and goes to 0 with the input of the first pulse and subsequent pulses are up-counted.

When there are LEDs that are not turned on, the value of the pulse assignment signals corresponding to the off LEDs is 0, and for the LED that is to be turned off by the nth pulse after on (n is in the range of 1–15), the value of the pulse assignment signal is n.

When all of the LEDs are turned on, while they are to be turned off at different timings, the pulse assignment signal corresponding to the LED to be turned off first is 1, and the pulse assignment signal corresponding to the $16^{th}$ LED to be turned off is 0.

Because the value of the pulse assignment signal corresponding to said off LED is equal to the value of the pulse assignment signal corresponding to the LED that is the $16^{th}$ LED turned off, they are identified by enable signal DE. That is, if the enable signal output from signal holding unit 9 is active when latch signal S_LAT is input, the pulse assignment signal of 0 is recognized as data for an LED that is not turned on. On the other hand, if the enable signal output from signal holding unit 9 is active when latch signal S_LAT is input, the pulse assignment signal of 0 is recognized as a data for the $16^{th}$ LED that is turned off after on.

As shown in FIG. 9, the newly added circuit is composed of flip-flop circuits FF1, FF2, inverter INV1, exclusive-OR-gate EXOR1, and OR-gate OR1, and this circuit outputs pulse signals corresponding to enable signal DE (out) and pulse string PS. The circuit contained in comparison unit 6 includes comparator CMP, flip-flop circuits FF3, FF4, inverter INV2, exclusive-OR-gate EXOR2, OR-gate OR2, NAND-gate NAND1 and AND-gate AND1. Except flip-flop circuit FF3, the other circuits have one group for each output of comparison unit 6, that is, they have 16 groups in this example.

When latch signal S_LAT is input, the count value of counting unit 5 is reset to 15, and the outputs of flip-flop circuits FF1, FF2, FF4 are set to the low level, while the output of flip-flop circuit FF3 is set to the high level. Then, as the first pulse of pulse string PS is input, a one-shot pulse is generated by means of flip-flop circuits FF1, FF2, inverter INV1 and exclusive-OR-gate EcoR. Consequently, regardless of the logic value of the enable signal output from signal holding unit 9, the pulse is sent to counting unit 5 and flip-flop circuits FF3, FF4.

When the first pulse is supplied, the count value of counting unit 5 goes to 0, and the value of the pulse assignment signal and said count value are compared at comparator CMP. In this case, as long as no agreement signal of high level, indicating agreement between the value of the pulse assignment signal and the count value, is output from comparator CMP, a high-level signal is output from flip-flop circuit FF4, and an instruction turning on the LED is sent to pulse signal output unit 7.

Here, when the output signal of comparator CMP is at the high level, the output of flip-flop circuit FF4 depends on the logic level of enable signal DE (out) output from signal holding unit 9. When said enable signal DE (out) is at the high level, the output of OR-gate OR2 goes to the high level, and the logic level of the output of flip-flop circuit FF4 changes corresponding to the level of the output of comparator CMP. On the other hand, when said enable signal DE (out) is at the low level, the output of OR-gate OR2 goes to the low level and, regardless of the logic level of comparator CMP, the output of flip-flop circuit FF4 goes to the high level.

In this way, when the value of the pulse assignment signal is 0, and the first pulse of the pulse string is input, if the enable signal output from signal holding unit 9 is at the low level, the pulse assignment signal is recognized as a data for LED that is the $16^{th}$ LED turned off. On the other hand, when the value of the pulse assignment signal is 0 and the first pulse of the pulse string is input, if the enable signal output from signal holding unit 9 is at the high level, said pulse assignment signal is recognized as a data for LED that is not turned on.

In said Embodiment 2, the constitution has latch signal S_LAT sent from control unit 1A. However, one may also use a constitution in which said latch signal S_LAT is generated using the first pulse of pulse string PS in pulse signal generator PGA(i,j). For example, if clock signal CLK is controlled in such a way that when the first pulse of pulse string PS is input, clock signal CLK goes to the high level, and when the second and subsequent pulses are input, clock signal CLK goes to the low level, one can obtain a latch signal synchronously with said first pulse with the logic circuit.

Embodiment 3

Embodiment 3 of the present invention will be explained below.

In Embodiment 3, for example, operation of control unit 1A of the display device shown in FIG. 6 is changed in accordance with the explanation below. Also, the remaining features of the constitution and operation may be the same as those of the display device shown in FIG. 6.

Figure 10:
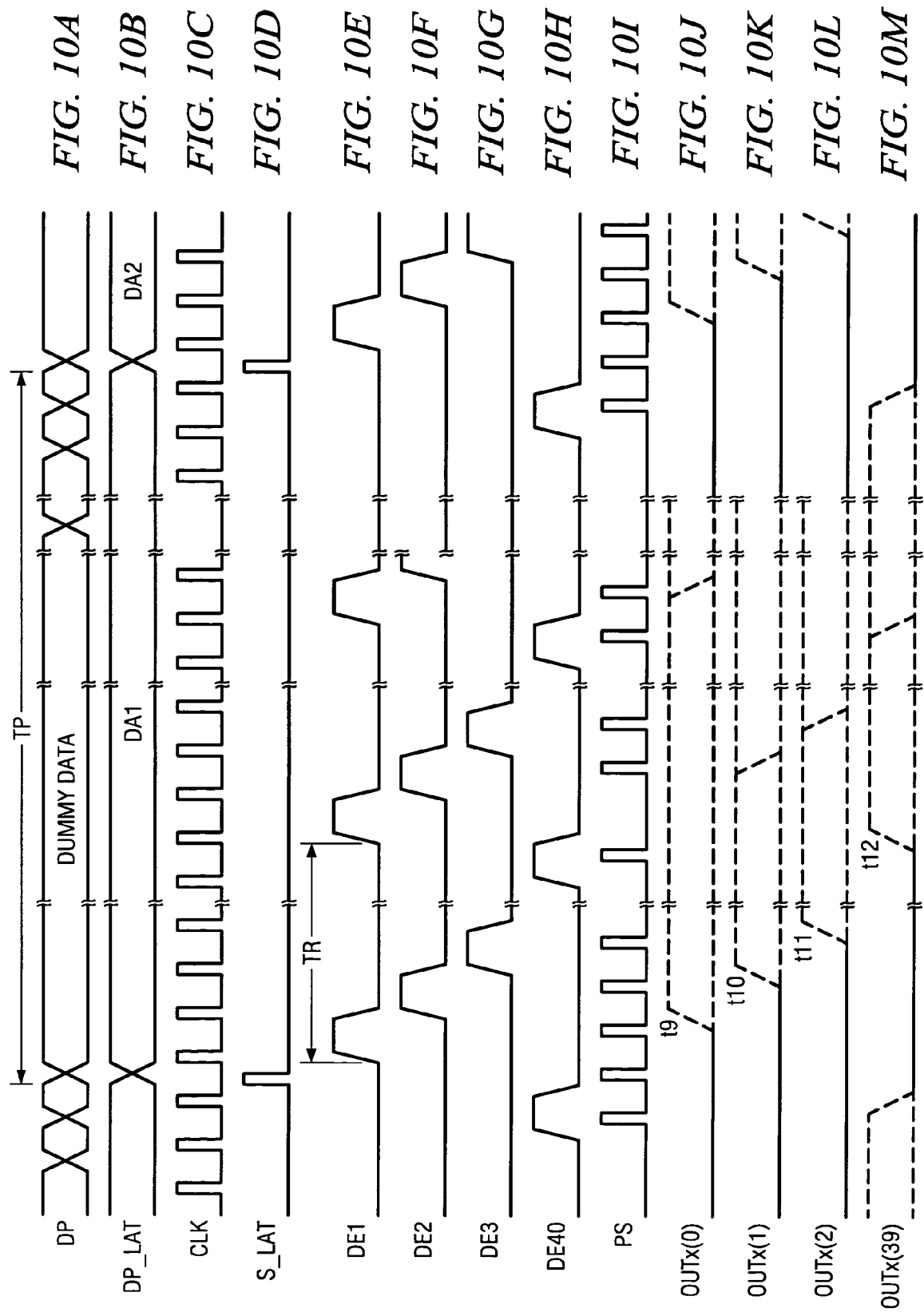
FIG. 10 is a timing diagram illustrating an example of the timing relationship between the various signals in the display device of Embodiment 3 shown in FIG. 6.

FIG. 10 is a timing diagram illustrating an example of the timing relationship of the various signals of the display device of Embodiment 3 of the present invention shown in FIG. 6.

FIG. 10(A) is a diagram illustrating the signals output from control unit 1A.

FIG. 10(B) is a diagram illustrating the pulse assignment signal held in signal holding unit 4 of pulse signal generator PGA(i,j).

FIG. 10(C) is a diagram illustrating clock signal CLK output from control unit 1A.

FIG. 10(D) is a diagram illustrating latch signal S_LAT output from control unit 1A.

FIGS. 10(E)–(H) illustrate enable signals DE0–DE39 held in signal holding unit 9 of pulse signal generators PGA(i,0)–PGA(i,39).

FIG. 10(I) is a diagram illustrating pulse string PS output from control unit 1A.

FIGS. 10(J)–(M) illustrate the pulse currents output from the various output channels of pulse signal generators PGA (i,0)–PGA(i,39).

As shown in FIGS. 10(E)–(H), during period Tr, the enable signal of value "1" is held in signal holding unit 9 in the order of pulse signal generators PGA(i,0), PGA(i,1), . . . PGA(i,39). During the period when the enable signal of value "1" is held in one pulse signal generator, the enable signal of value "0" is held in the other pulse signal generators. That is, during period Tr, the enable signal, which is set such that the input of pulses to pulse signal generators PGA(i,0)–PGA(i,39) are sequentially made valid, is output from control unit 1A, and this enable signal transmission treatment is performed repeatedly in 256 cycles (the gray scale) during period Tp.

On the other hand, for pulse string PS output from control unit 1A (FIG. 10(I)), in the various periods when the pulse input to pulse signal generators PGA(i,0)–PGA(i,39) is made valid by means of transmission treatment of the enable signal, the presence or absence of the pulse is set corresponding to the desired pulse width of each output channel. Pulse string PS is output to all pulse signal generators PGA(i,0)–PGA(i,39). However, since the pulse input is made valid for only one of these pulse signal generators, it is possible to individually specify whether the count value is to be incremented by a particular pulse signal generator. That is, the operation can be performed in the same way as that in the display device shown in FIG. 2 for each pulse signal generator.

The timing relationship of other signals output from control unit 1A is the same as that in FIGS. 8 and 9.

As explained above even when the operation of control unit 1A is changed to the operation shown in the timing diagram in FIG. 10, like the display device shown in FIG. 2, it is still possible to control the pulse interval of the pulse string input to counting unit 5 of each pulse signal generator corresponding to the desired pulse width in each output channel. Consequently, even when the operation of control unit 1A makes the aforementioned change, it is still possible to realize the same effects as those described in relation to Embodiment 2.

In addition, due to said operation of control unit 1A, as shown in FIGS. 10(J)–(M), it is possible to shift the time when the level of driving pulse signals (OUTx0–OUTx39) of pulse signal generators PGA(i,0)–PGA(i,39) is changed by a time interval corresponding to the period of pulse string PS.

In the display device shown in FIG. 6, for example, at time t8 shown in FIG. 8, the drive pulse signals of pulse signal generators PGA(i,0)–PGA(i,39) all change to the high level. Consequently, the power source current rises rapidly, leading to generation of significant noise, which is undesirable. In order to solve this problem, in this embodiment, as shown at time t9–t12 in FIG. 10, the time that the level of the drive pulse signal is changed is shifted for each pulse signal generator, so that rapid changes in the power source current can be suppressed.

Embodiment 4

Embodiment 4 of the present invention will be explained below.

In the display device of Embodiment 4, for example, control unit 1A and pulse signal generator PGA(i,j) in the display device shown in FIG. 6 are replaced with control unit 1B and pulse signal generating unit PGB(i,j), to be explained below.

Figure 11:
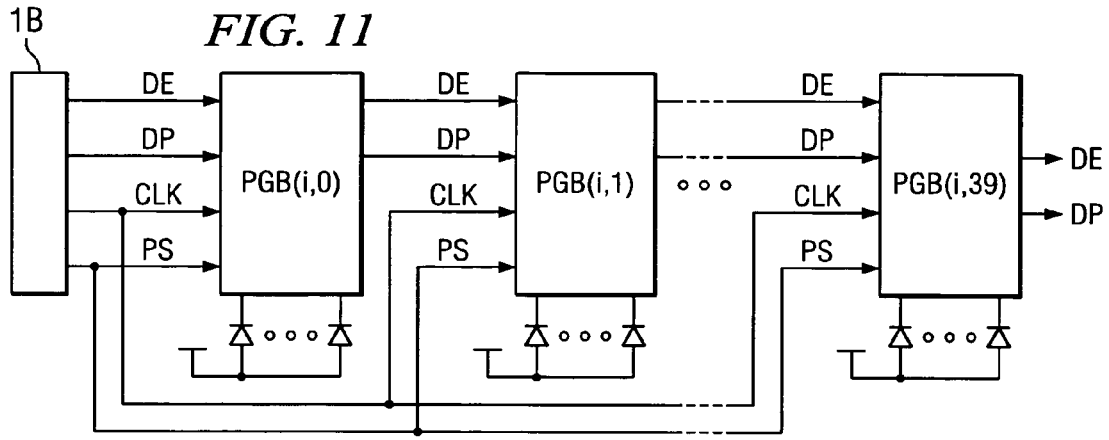
FIG. 11 is a block diagram illustrating the constitution of 1 horizontal line extracted from the display device pertaining to Embodiment 4 of the present invention.

FIG. 11 is a block diagram illustrating the display device in Embodiment 4 of the present invention. It shows the constitution of the extracted portion corresponding to 1 horizontal line.

As can be seen by comparing the block diagrams of FIGS. 6 and 11, latch signal S_LAT output from control unit 1A to pulse signal generator PGA(i,j) in the display device shown in FIG. 6 is deleted between control unit 1B and pulse signal generating unit PGB(i,j) shown in FIG. 11.

In addition, the input and output signals of control unit 1A and pulse signal generator PGA(i,j) are identical to those of control unit 1B and pulse signal generating unit PGB(i,j).

Figure 12:
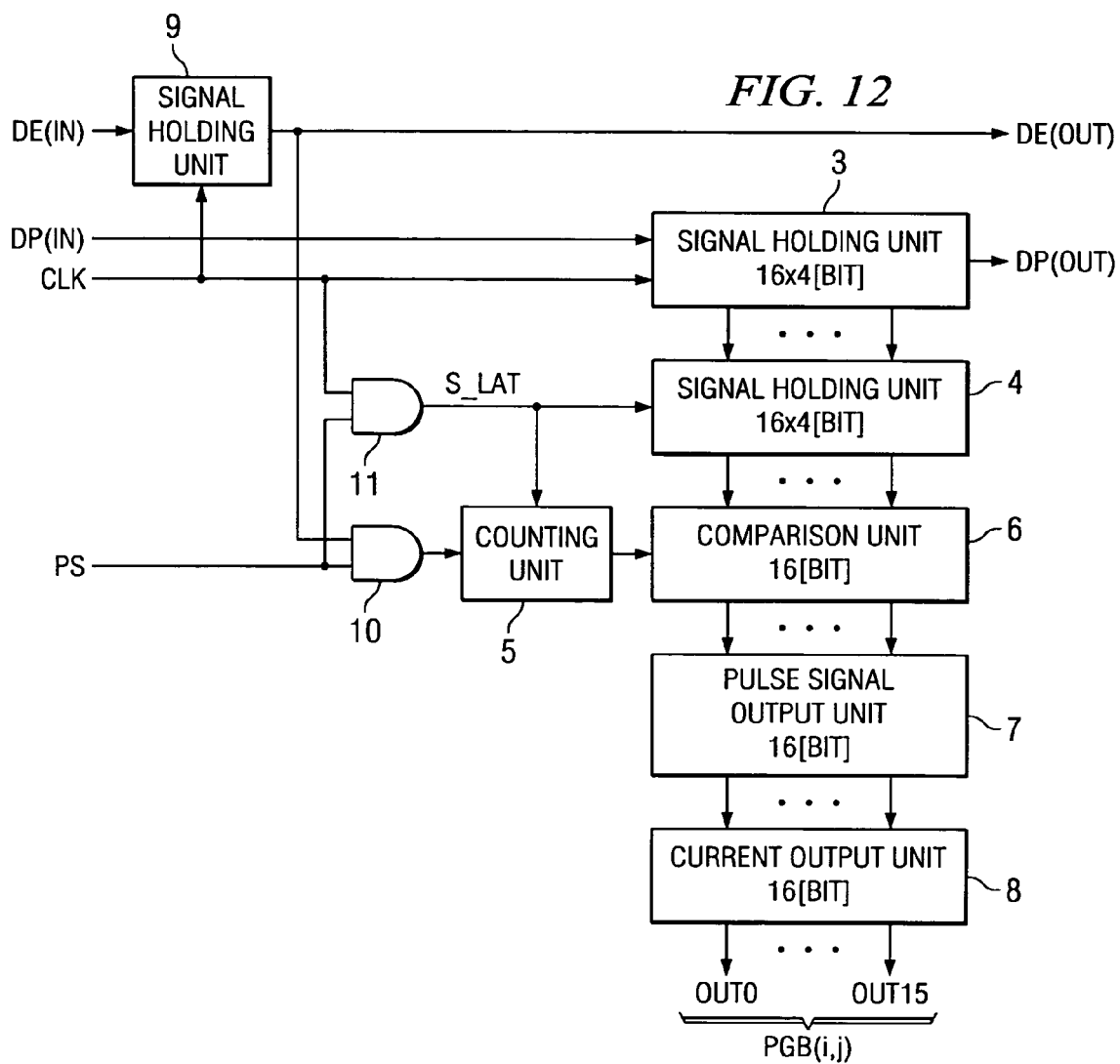
FIG. 12 is a block diagram illustrating an example of the constitution of the pulse signal generating unit pertaining to Embodiment 4 of the present invention.

FIG. 12 is a block diagram illustrating an example of the constitution of pulse signal generating unit PGB(i,j) pertaining to Embodiment 4 of the present invention. FIGS. 7 and 11 share the same part numbers.

As shown in FIG. 12, pulse signal generating unit PGB (i,j) has the same constitution as pulse signal generator PGA(i,j). It also contains AND-gate 11.

AND-gate 11 represents an embodiment of the logic operation means of the present invention.

AND-gate 11 finds the logical product of clock signal CLK and pulse string PS and outputs the result as latch signal S_LAT to signal holding unit 4 and counting unit 5.

The operation of the display device with the aforementioned constitution will be explained below with reference to the timing diagram of FIG. 13.

FIG. 13(A) is a diagram illustrating the signals output from control unit 1B.

FIG. 13(B) is a diagram illustrating the pulse assignment signal held in signal holding unit 4 of pulse signal generating unit PGB(i,j).

FIG. 13(C) is a diagram illustrating enable signal DE output from control unit 1B.

FIG. 13(D) is a diagram illustrating clock signal CLK output from control unit 1B.

FIG. 13(E) is a diagram illustrating pulse string PS output from control unit 1B.

FIG. 13(F) is a diagram illustrating the pulse currents output from the output channels of pulse signal generating units PGB(i,0)–PGB(i,39).

As shown in FIGS. 13(D) and (E), by means of control unit 1B, clock signal CLK and pulse string PS are set with an appropriate phase relationship so that their high-level periods do not overlap. Clock signal CLK contains clock pulses with their pulse width adjusted appropriately so that pulse string PS overlaps the clock signal for the high-level period only for one pulse during period Tp (times t13, t14). Since the high-level periods of the two signals overlap by means of appropriate clock pulses, the output signal of AND-gate 11 goes to the high level, and the holding operation of the pulse assignment signal in signal holding unit 4 and the initialization operation of the count value in counting unit 5 are performed.

The other operations are the same as those of the display device shown in FIG. 6 pertaining to Embodiment 2.

Consequently, the display device shown in FIG. 11 can operate identically to the display device of Embodiment 2, realizing the same effects. Also, it is possible to reduce the latch signal output from the control unit to the pulse signal generators. As a result, it is possible to reduce the wiring of the circuit and the cost. Also, it is possible to reduce the number of pulse signal generator input terminals. Consequently, when the system is realized in the form of an IC, it is possible to have a small package size with relatively few pins.

Embodiment 5

Embodiment 5 of the present invention will be explained below.

For example, in the display device of Embodiment 5, the operation of control unit 1B of the display device shown in FIG. 11 is changed as follows. The other features of the constitution and operation are the same as those for the display device of FIG. 11.

FIG. 14 is a timing diagram illustrating an example of the timing relationship of the various signals of the display device of Embodiment 5 of the present invention shown in FIG. 11.

FIG. 14(A) is a diagram illustrating the signals output from control unit 1B.

FIG. 14(B) is a diagram illustrating the pulse assignment signal held in signal holding unit 4 of pulse signal generating unit PGB(i,j).

FIG. 14(C) is a diagram illustrating clock signal CLK output from control unit 1B.

FIGS. 14(D)–(G) illustrate enable signals DE0–DE39 held in signal holding units 9 of pulse signal generating units PGB(i,0)–PGB(i,39), respectively.

FIG. 14(H) is a diagram illustrating pulse string PS output from control unit 1B.

FIGS. 14(I)–(L) illustrate the pulse currents output from the output channels of pulse signal generating units PGB(i,0)–PGB(i,39), respectively.

As shown in FIGS. 14(D)–(G), during period Tr, the enable signal with a value of "1" is held in signal holding units 9 in the order of pulse signal generating units PGB(i,0), PGB(i,1), ... PGB(i,39). During the period when the enable signal with value of "1" is held in one pulse signal generator, enable signals with a value of "0" are held in the other pulse signal generators. That is, during period Tr, enable signals output from control unit 1B are set in such a way that the input of pulses is made valid sequentially for pulse signal generating units PGB(i,0)–PGB(i,39). This enable signal's transmission treatment is performed repeatedly for 256 cycles (the gray scale) during period Tp.

For pulse string PS output from control unit 1B (FIG. 14(H)), in the period when pulse input to pulse signal generating units PGB(i,0)–PGB(i,39) is made valid by means of the transmission treatment of said enable signal, presence or absence of pulse is set corresponding to the desired pulse width of each output channel. Although pulse string PS is output to all pulse signal generating units PGB(i,0)–PGB(i,39), the pulse input is made valid only for one of said pulse signal generators. Consequently, whether the count value is to be incremented can be set individually for each pulse signal generator. That is, it can perform the same operation as that of the display device shown in FIG. 2, in which the pulse string is supplied individually to each pulse signal generator.

The timing relationship for the remaining signals output from control unit 1B is the same as that shown in FIGS. 13 and 14.

As explained above, even when the operation of control unit 1B is changed to the operation shown as the timing diagram in FIG. 14, as in the display device shown in FIG. 2, it is possible to control the pulse interval of the pulse string input to counting unit 5 of each pulse signal generator corresponding to the desired pulse width of each output channel. Consequently, even when the operation of control unit 1B is changed as described above, the same effects as those of Embodiment 4 can be obtained.

In addition, in said operation of control unit 1B, the time for a change in the level of drive pulse signals (OUTx0–OUTx39) of pulse signal generating units PGB(i,0)–PGB(i,39) is shifted for the time interval corresponding to the period of pulse string PS. Consequently, it is possible to reduce variations in the power source voltage and increases in noise due to rapid changes in the power source current.

Embodiment 6

Embodiment 6 of the present invention will be explained below.

For the display device in Embodiment 6, for example, control unit 1 and pulse signal generating units PG(i,j) in the display device shown in FIG. 1 are replaced by control unit 1C and pulse signal generating units PGC(i,j), to be explained below.

Figure 15:
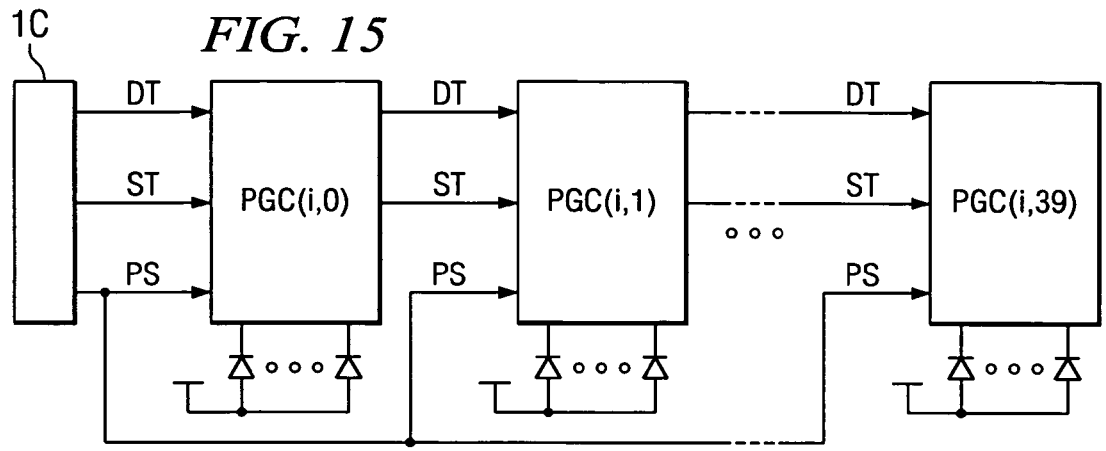
FIG. 15 is a block diagram illustrating the constitution of 1 horizontal line extracted from the display device of Embodiment 6 of the present invention.

FIG. 15 is a block diagram illustrating the constitution of a horizontal line extracted from the display device in Embodiment 6 of the present invention.

Pulse string PS and signals DT and ST for packet transmission are input to pulse signal generating unit PGC(i,j).

As shown in FIG. 15, pulse signal generating units PGC(i,0)–PGC(i,39) are connected in cascade via the input/output terminals of packet-transmission signals DT and ST. Packet-transmission signals DT and ST output from control unit 1C are input to pulse signal generating unit PGC(i,0) of the initial stage, and the packet-transmission signals output from the previous stage are input to corresponding subsequent pulse signal generators of the various stages following the initial stages.

Control unit 1C outputs common pulse string PS to pulse signal generating units PGC(i,0)–PGC(i,39), and at the same time, outputs packet-transmission signals DT and ST to initial-stage pulse signal generating unit PGC(i,0).

FIG. 16 is a block diagram illustrating an example of the constitution of pulse signal generating unit PGC(i,j) pertaining to Embodiment 6 of the present invention.

Pulse signal generating unit PGC(i,j) includes packet-signal processing unit 12, counting unit 5, comparison unit 6, pulse signal output unit 7, current output unit 8, and AND-gate 10. FIGS. 7 and 16 have the same part numbers.

Packet signal processing unit 12 represents an embodiment of the packet signal processing means of the present invention.

For example, packet-transmission signals DT and ST that are encoded using the DS-LINK system are input to packet signal processing unit 12, which decodes them, and then reproduces the data signal and clock signal. Then, the packet signal is extracted from the reproduced data signal, and on the basis of the identification information contained in the extracted packet signal, it is determined whether the packet signal should be received. For example, when the identification information contained in the packet signal agrees with the pre-allotted identification information, it is decided that the packet signal is to be received. When the decision for reception is determined, the following signals are extracted from the received packet signals: 16×4-bit pulse assignment signal sent to comparison unit 6, latch signal S_LAT for initialization of the count value in counting unit 5, and enable signal DE for calculating the logical product of pulse string PS in AND-gate 10.

Also, in packet signal processing unit 12, for example, the data signal and clock signal decoded from packet-transmission signals DT and ST are again encoded with the DS-LINK system, and they are then output to the next-stage pulse signal generator.

With respect to the display device with the aforementioned constitution shown in FIG. 15, in the display device shown in FIG. 6, enable signal DE, pulse assignment signal DP and latch signal S_LAT supplied from control unit 1A to pulse signal generating unit PGA(i,j) are all formed into packets by control unit 12C, and they are then sent to pulse signal generating units PGC(i,0)–PGC(i,39). Control unit IC generates packet signals (DT, ST) and pulse string PS such that said signals reproduced from the packet signals in packet signal processing unit 12 and pulse string PS have the same timing relationship as that of the timing diagrams shown in FIGS. 8 and 10. Consequently, like the display device shown in FIG. 6, the display device shown in FIG. 15 can select and count a portion of the pulses for each pulse signal generator from the common pulse string PS with counting unit 5, and it is possible to suppress the data length of the pulse assignment signal.

The present invention is not limited to the aforementioned embodiments.

For example, in the aforementioned embodiments, the following systems can be used as the system for transmitting the control signal from the control unit to the pulse signal generators: a system in which signals of one or more bits are sequentially shifted from the initial stage to the last stage in the pulse signal generators connected in cascade; and a system in which control signals in packet form are transmitted using the DS_LINK system or other high-speed encoding system. However, the present invention is not limited to these systems. For example, one may also adopt the system that makes use of data bus and address bus generally used as information between CPU and the peripheral devices, or various other signal transmission systems.

Also, in the aforementioned embodiments, in the pulse signal generators, the count value of the pulse string in the counting unit is used in judging the arrival of the prescribed pulse assigned by the pulse assignment signal from the pulses of the input pulse string. However, the present invention is not limited to this method.

That is, in addition to the aforementioned method that is based on counting pulses, other methods can be adopted for assigning the prescribed pulse in the pulse string. For example, one may use information pertaining to pulse amplitude and width in the pulse assignment.

In the method using pulse amplitude to specify the pulse, for example, the following scheme may be adopted: the amplitude of the input pulse is converted into a digital signal with an A/D converter, and the signal is compared to the pulse assignment signal by means of a comparator to determine whether the specific pulse assigned by the pulse assignment signal has arrived, followed by level inversion of the output pulse in the pulse signal output unit.

In the method using pulse width to specify the pulse, for example, the following scheme may be adopted: the pulse width of the input pulse is converted into a digital signal using a counter or the like, and the signal is compared to the pulse assignment signal by means of a comparator to determine whether the specific pulse assigned by the pulse assignment signal has arrived, followed by level inversion of the output pulse in the pulse signal output unit.

In the aforementioned embodiments, as an example, the case when there are 16 channels for the output of each pulse signal generator with 256 levels has been explained. However, the present invention is not limited to this scheme. A different number of levels and output channels may also be used. Also, the display size of the display device may be selected as desired.

Also, in the aforementioned example, after plural LEDs are turned on simultaneously or sequentially, the off timing of the LEDs is controlled corresponding to the grayscale. However, control may also be executed so that the plural LEDs are turned on with any desired timing, and the LEDs turned off simultaneously or sequentially.

The display device shown in FIG. 1 was explained on the basis of an example with 4 horizontal lines driven in time-division fashion. However, any desired number of time divisions may be adopted in the present invention. For example, one may omit the horizontal line selecting unit, and not perform the time division operation of the horizontal lines.

In the aforementioned embodiment, the present invention was explained with reference to an example of an LED display device. However, the present invention is not limited to LED display devices. It may be generally adopted for liquid-crystal display devices, PDP (plasma display panels), and other display devices of with grayscale data.

The present invention provides a pulse signal generator with a simple constitution with which the pulse width can be set so as to reduce the quantity of information to be transmitted. Also, the present invention provides a display device with a simple constitution incorporating said pulse signal generator. Also, it is possible to perform the desired control of the display resolution of the display device by simply changing the controller (control unit) in the display device.

REFERENCE NUMERALS AND SYMBOLS AS SHOWN IN THE DRAWINGS n the figures, 1, 1A, 1B, 1C represents control units; 2_0–2_119 horizontal line selection units; PG(i,j), PGA(i,j), PGB(i,j), PGC(i,j) pulse signal generating units; DA0–DA119 diode arrays; 3, 4, 8 signal holding units; 5 a counting unit; 6 a comparison unit; 7 a pulse signal output unit; and 9, 10 AND-gates.

The invention claimed is:

1. A pulse signal generator comprising:
the pulse signal generator generates plural pulse signals and comprises:
a pulse arrival notification means that reports the arrival of a pulse, which is contained in the input pulse string and which is input when an enable signal indicating permission for pulse input is given, together with the information that specifies said pulse;
a pulse arrival judgment means, which uses pulse assignment signals corresponding to said pulse signals to be generated as input, and which determines whether a pulse assigned with each of said pulse assignment signals has arrived for each of said pulse signals on the basis of the notification of said pulse arrival notification means;
and a pulse signal output means that inverts the output level of pulse signal, for which arrival of said assigned pulse is judged by said pulse arrival judgment means, synchronization with the arrival of said pulse.

2. The pulse signal generator described in claim 1, comprising: a first signal holding means that holds a signal input to a first input terminal and outputs the held signal to a first output terminal synchronously with a clock signal;
wherein said pulse arrival notification means has the signal held in said first signal holding means input to it as said enable signal.

3. The pulse signal generator described in claim 1 further comprising: a second signal holding means that holds a signal input to a second input terminal and outputs the held signal to a second output terminal synchronously with a clock signal; and
a third signal holding means that holds the signal held in said second signal holding means synchronously with an input latch signal;
wherein said pulse arrival judgment means has the signal held in said third signal holding means input to it as said pulse assignment signal.

4. The pulse signal generator described in claim 3, wherein said clock signal contains clock pulses, one at a prescribed period, with the result of a prescribed logic operation made between said clock pulses and said pulse string becoming a prescribed value;

and comprising a logic operation means that outputs said result of the logic operation between said clock signal and said pulse string as said latch signal.

5. The pulse signal generator described in claim 4, wherein said pulse arrival notification means counts the pulses that are contained in said input pulse string and that are input when said enable signal indicating permission for pulse input is given, and initializes said counting result corresponding to the result of operation of said logic operation means; and wherein said pulse arrival judgment means compares said pulse assignment signal to the counting result of said pulse arrival notification means, and judges the arrival of said assigned pulse corresponding to the result of the comparison.

6. The pulse signal generator described in claim 1, further comprising a packet signal processing means, which determines whether the packet signal is to be received corresponding to the identification information contained in the input packet signal, and, when decision is made to receive, extracts said enable signal and/or said pulse assignment signal from said packet signal.

7. A display device comprising:
plural display elements;
one or more pulse signal generators that generate plural pulse strings for driving said display elements;
and a control means that generates a pulse string with its pulse interval set corresponding to a desired pulse width of said pulse signal, and a pulse assignment signal that assigns the prescribed pulse in said input pulse string for each said pulse signal to be generated, and sends said signals to said pulse signal generators;
wherein said pulse signal generator comprises:
a pulse arrival notification means that reports the arrival of the pulse, which is contained in the input pulse string and which is input when an enable signal indicating permission for pulse input is given, together with the information that specifies said pulse;
a pulse arrival judgment means, which uses the pulse assignment signals corresponding to said pulse signals to be generated as input, and which determines whether a pulse assigned with each of said pulse assignment signals has arrived for each of said pulse signals on the basis of the notification of said pulse arrival notification means;
and a pulse signal output means that inverts the output level of the pulse signal, for which arrival of said assigned pulse is judged by said pulse arrival judgment means, synchronously with the arrival of said pulse.

8. The display device described in claim 7, wherein said pulse arrival judgment means reports the arrival of the pulse that is contained in said pulse string and that is input when an enable signal indicating permission for pulse input is given; and wherein said control means outputs said pulse string commonly to plural pulse signal generators, and, at the same time, generates said enable signal, which grants or denies permission for pulse input corresponding to said pulse width in each pulse signal generator, in each pulse cycle of said pulse string.

9. The display device described in claim 7, wherein said pulse arrival judgment means reports the arrival of the pulse that is contained in said pulse string and that is input when an enable signal indicating permission for pulse input is given;

and said control means generates said enable signal that sequentially permits said pulse input for the plural pulse signal generators, and, at the same time, it outputs said pulse string, which sets presence or absence of the pulse in each period where pulse input of said plural pulse signal generators is permitted corresponding to said desired pulse width, commonly to said plural pulse signal generators.

10. The display device described in claim 8 wherein each of said pulse signal generators also includes a first signal holding means that holds the signal input to the first input terminal and outputs the held signal to the first output terminal synchronously with the input clock signal;

said pulse arrival notification means has the signal held in said first signal holding means input to it as said enable signal;

said plural pulse signal generators are connected in cascade via said first input terminals and said first output terminals;

and said control means feeds said enable signals sent to said various stages of pulse signal generators connected in cascade sequentially to the initial stage of said cascade connection synchronously with said clock signal.

11. The display device described in claim 8 wherein each of said pulse signal generators includes a second signal holding means that holds the signal input to a second input terminal and outputs the held signal to a second output terminal synchronously with the input clock signal; and a third signal holding means that holds the signal held in said second signal holding means corresponding to an input latch signal;

said pulse arrival notification means has the signal held in said third signal holding means as a pulse indicating signal;

said plural pulse signal generators are connected in cascade via said second input terminals and said second output terminals;

and said control means supplies said pulse indicating signals sent to said various stages of pulse signal generators connected in cascade sequentially to the initial stage of said cascade connection synchronously with said clock signal and generates said input latch signal that holds said held signal in said third signal holding means at the timing for holding said pulse indicating signal in said second signal holding means of the pulse signal generator as the supplied object.

12. The display device described in claim 11, wherein said control means generates said clock signal, with one clock pulse, for which the result of the prescribed logic operation with said pulse string becomes a prescribed value, in a prescribed period;

and said pulse signal generator contains a logic operation means that outputs the result of said logic operation between said clock signal and said pulse string as said latch signal.

13. The display device described in claim 12 wherein said pulse arrival notification means counts the pulses that are contained in the pulse string and that are input when said enable signal indicating permission for pulse input is given, and initializes said counting result corresponding to the result of operation of said logic operation means;

said pulse arrival judgment means compares said pulse assignment signal to the counting result of said pulse arrival notification means, and judges the arrival of said assigned pulse corresponding to the comparison result.

14. The display device described in claim 7, further comprising a packet signal processing means, which generates a packet signal containing at least one of said enable signal and/or said pulse assignment signal sent to said pulse signal generators;

respectively, and an identification information that indicates the destination pulse signal generator;

and which determines whether said packet signal is to be received corresponding to said identification information contained in said packet signal, and, when the decision is made for reception, extracts said enable signal and/or said pulse assignment signal from said packet signal.

15. A pulse signal generator comprising:

a pulse signal generator is used to control a logic level of an output pulse signal corresponding to arrival of a pulse signal;

wherein the pulse signal generator comprises a pulse assignment signal holding circuit that holds a pulse assignment signal for assigning one pulse signal in a pulse string supplied during a prescribed period as a response to an initialization signal, a counting circuit, which resets a count value at a prescribed value as a response to said initialization signal, and which increments or decrements said count value corresponding to input of said pulse signal, a comparator that compares a value of the pulse assignment signal held in said pulse assignment signal holding circuit with said count value of said counting circuit;

and a pulse signal output circuit that controls a logic level of said output pulse signal in response to a comparison result signal output from said comparator.

16. The pulse signal generator described in claim 15, further comprising an enable signal holding circuit that holds an enable signal in response to a clock signal;

and a controller that controls supplying said pulse signal to said counting circuit responsive to said enable signal held in said enable signal holding circuit.

17. The pulse signal generator described in claim 15 further comprising a logic circuit that generates said initialization signal on the basis of the first initial pulse signal in the pulse string fed during a prescribed period.

18. The pulse signal generator described in claim 15 wherein the timing of arrival of said pulse signal corresponds to gradation data in the display device.

19. The display device described in claim 9 wherein each of said pulse signal generators includes a second signal holding means that holds the signal input to a second input terminal and outputs the held signal to a second output terminal synchronously with the input clock signal; and a third signal holding means that holds the signal held in said second signal holding means corresponding to an input latch signal;

said pulse arrival notification means has the signal held in said third signal holding means as a pulse indicating signal;

said plural pulse signal generators are connected in cascade via said second input terminals and said second output terminals;

and said control means supplies said pulse indicating signals sent to said various stages of pulse signal generators connected in cascade sequentially to the initial stage of said cascade connection synchronously with said clock signal and generates said input latch signal that holds said held signal in said third signal holding means at the timing for holding said pulse indicating signal in said second signal holding means of the pulse signal generator as the supplied object.

20. The display device described in claim 10 wherein each of said pulse signal generators includes a second signal holding means that holds the signal input to a second input terminal and outputs the held signal to a second output terminal synchronously with the input clock signal; and a third signal holding means that holds the signal held in said second signal holding means corresponding to the input latch signal;

said pulse arrival notification means has the signal held in said third signal holding means as said pulse indicating signal;

said plural pulse signal generators are connected in cascade via said second input terminals and said second output terminals;

and said control means supplies said pulse indicating signals sent to said various stages of pulse signal generators connected in cascade sequentially to the initial stage of said cascade connection synchronously with said clock signal and generates said latch signal that holds said held signal in said third signal holding means at the timing for holding said pulse indicating signal in said second signal holding means of the pulse signal generator as the supplied object.

* * * * *